US006977487B2

(12) United States Patent
Fujioka et al.

(10) Patent No.: US 6,977,487 B2
(45) Date of Patent: Dec. 20, 2005

(54) VEHICULAR ALTERNATOR FAILURE DETERMINATION APPARATUS USING COMMUTATING DEVICE VOLTAGE

(75) Inventors: Hiroshi Fujioka, Tokyo (JP); Takanori Matsunaga, Tokyo (JP); Takashi Maeda, Tokyo (JP); Toshinori Matsui, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 195 days.

(21) Appl. No.: 10/382,535

(22) Filed: Mar. 7, 2003

(65) Prior Publication Data

US 2004/0066200 A1   Apr. 8, 2004

(30) Foreign Application Priority Data

Oct. 8, 2002   (JP) .............................. 2002-295237

(51) Int. Cl.⁷ ............................ H02P 9/46; H02P 9/00; H02P 11/00; H02H 7/06
(52) U.S. Cl. ............................ 322/47; 322/99; 322/28; 322/25; 322/59
(58) Field of Search ............................. 322/25, 28, 47, 322/59, 99

(56) References Cited

U.S. PATENT DOCUMENTS

| | | | | |
|---|---|---|---|---|
| 3,701,938 A | * | 10/1972 | Philip ........................... | 363/51 |
| 3,950,684 A | * | 4/1976 | Peterson ..................... | 388/806 |
| 4,016,468 A | * | 4/1977 | Graf ............................. | 318/434 |
| 4,045,887 A | * | 9/1977 | Nowell ......................... | 361/98 |
| 4,164,785 A | * | 8/1979 | Young et al. .................. | 363/50 |
| 4,169,990 A | * | 10/1979 | Lerdman .................... | 318/138 |
| 4,284,932 A | * | 8/1981 | Kawada et al. ............. | 388/804 |
| 4,417,194 A | * | 11/1983 | Curtiss et al. ................ | 322/47 |
| 4,459,519 A | * | 7/1984 | Erdman ....................... | 318/254 |
| 4,459,548 A | | 7/1984 | Lentz et al. ................. | 324/772 |
| 4,467,408 A | * | 8/1984 | Matulevich et al. .......... | 363/54 |
| 4,654,566 A | * | 3/1987 | Erdman ....................... | 318/254 |
| 4,794,316 A | * | 12/1988 | Uchino et al. ................ | 322/47 |
| 4,831,611 A | * | 5/1989 | Sasaki et al. ............. | 369/53.31 |
| 4,843,307 A | * | 6/1989 | Ichijyo ................... | 324/103 P |
| 4,864,088 A | * | 9/1989 | Hiejima et al. ............. | 219/707 |
| 5,023,733 A | * | 6/1991 | Koga et al. .............. | 360/77.04 |
| 5,184,257 A | * | 2/1993 | Koga et al. .............. | 360/77.05 |
| 5,291,114 A | * | 3/1994 | Shirotori et al. ............ | 318/685 |
| 5,291,578 A | * | 3/1994 | Kalami ........................ | 388/831 |
| 5,369,541 A | | 11/1994 | Normet ....................... | 361/85 |
| 5,375,032 A | * | 12/1994 | Hatakeyama et al. ....... | 361/187 |
| 5,423,512 A | * | 6/1995 | Ushio et al. ................. | 250/205 |
| 5,644,212 A | * | 7/1997 | Takahashi .................... | 320/134 |

(Continued)

FOREIGN PATENT DOCUMENTS

JP   54153237 A  * 12/1979  .......... H02M 7/155

(Continued)

*Primary Examiner*—Darren Schuberg
*Assistant Examiner*—Pedro J. Cuevas
(74) *Attorney, Agent, or Firm*—Sughrue Mion, PLLC

(57) ABSTRACT

A vehicular alternator failure determination apparatus is capable of making a failure determination accurately. The apparatus includes a maximum voltage detection part (1) for detecting a maximum voltage of an alternator commutating device which commutates an AC output of the alternator driven by an engine, a minimum voltage detection part (2) for detecting a minimum voltage of the alternator commutating device, a voltage difference calculation part (3) for detecting a difference voltage from outputs of the maximum and minimum voltage detection parts, and a failure determination part (4) which determines that the alternator is in a failure state, when an output of the voltage difference calculation part is equal to or greater than a prescribed voltage.

11 Claims, 16 Drawing Sheets

U.S. PATENT DOCUMENTS

| | | | |
|---|---|---|---|
| 5,694,010 A * | 12/1997 | Oomura et al. | 318/254 |
| 6,031,738 A * | 2/2000 | Lipo et al. | 363/37 |
| 6,034,493 A * | 3/2000 | Boyd et al. | 318/254 |
| 6,215,261 B1 * | 4/2001 | Becerra | 318/254 |
| 6,351,397 B1 * | 2/2002 | Sawa et al. | 363/50 |
| 6,420,853 B1 * | 7/2002 | Harada et al. | 320/161 |
| 6,646,898 B2 * | 11/2003 | Furukawa et al. | 363/132 |
| 6,801,247 B1 * | 10/2004 | Ohishi et al. | 348/208.1 |
| 6,853,675 B1 * | 2/2005 | Oleynik | 375/130 |
| 2001/0054890 A1 | 12/2001 | Dennis et al. | 324/76.41 |

FOREIGN PATENT DOCUMENTS

| | | |
|---|---|---|
| JP | 55-099041 A | 7/1980 |
| JP | 1-25333 | 9/1989 |
| JP | 2-107300 U | 8/1990 |
| JP | 2002-027796 A | 1/2002 |

* cited by examiner

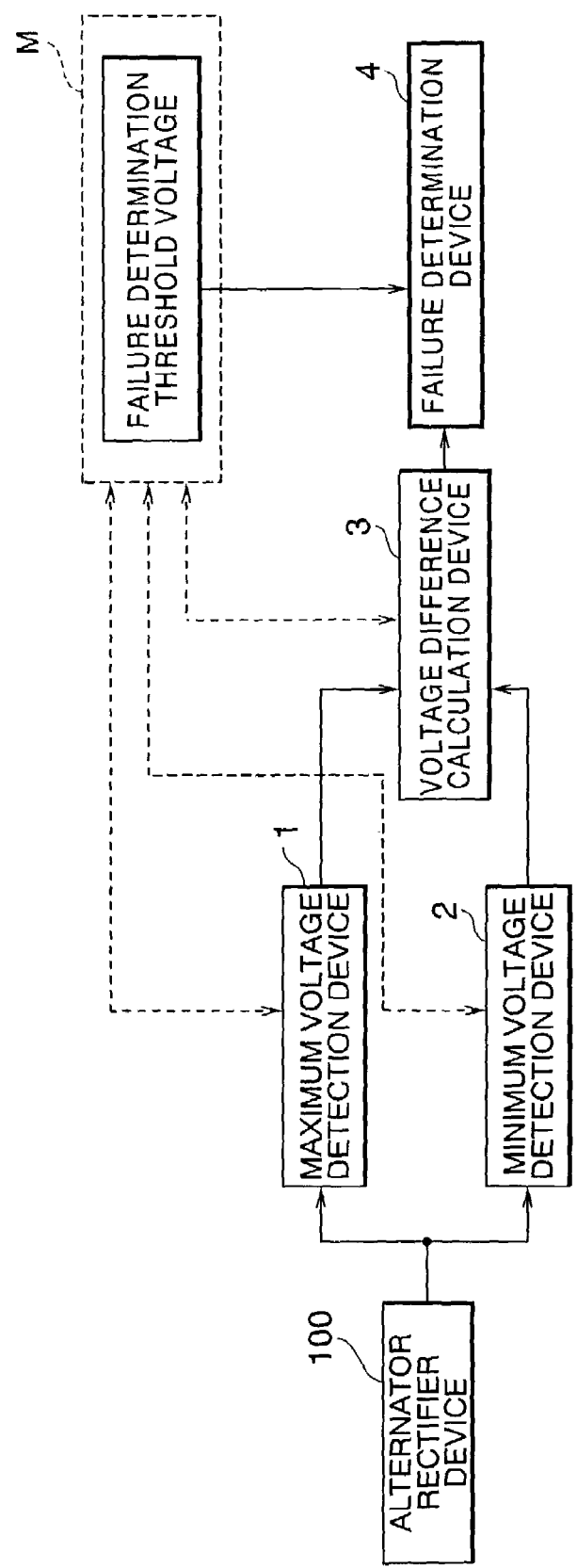

AXIS OF ORDINATE 0.5v/div
AXIS OF ABSCISSA 5ms/div
DURING POWER GENERATION
DUE TO CURRENT SUPPLY

OPEN FAILURE OF ONE
RECTIFIER ELEMENT

OPEN FAILURE OF TWO
RECTIFIER ELEMENTS

SHORT CIRCUIT
FAILURE OF ONE
RECTIFIER ELEMENT

BREAK FAILURE OF STATOR
COIL OF ONE PHASE

VEHICULAR ALTERNATOR FAILURE DETERMINATION APPARATUS USING COMMUTATING DEVICE VOLTAGE

BACKGROUND OF THE INVENTION

1. Field of the Invention

The present invention relates to a vehicular alternator failure determination apparatus, and more particularly, to the decision of failure determination conditions upon making a failure determination of a vehicular alternator.

2. Description of the Related Art

In diagnosis apparatuses for motor vehicles with known vehicular alternator failure determination means, the generation cycle or period of a ripple voltage in the output of a vehicular alternator rectifier or commutating device is measured so that a failure in a stator coil and commutator elements in the rectifier or commutating device is detected according to a variation in the ripple voltage generation cycle. Explaining this step by step, in a first step, the cycle or period of a ripple voltage waveform at a certain point in time is read in, and when the cycle thus read in is larger than zero or a predetermined value $\alpha$, it is determined that the stator coil is in a failure state. In a second step, a difference between the ripple voltage waveform cycle at the certain point in time and the last (i.e., one cycle before) ripple voltage waveform cycle is calculated, and if this difference or change is equal to or greater than a predetermined value $\beta$, it is determined that the commutating device is in a failure state. In a third step, an average or mean voltage is read in, and then in a fourth step, a difference between the average or mean voltage thus read and a reference voltage is calculated, and if the difference is equal to or greater than a predetermined value $\gamma$, it is determined that a voltage regulation device is in a failure state (for instance, see Japanese patent document 1: Japanese patent laid-open No. Hei 1-25333).

As explained above, in the known vehicular alternator failure means, a small ripple voltage waveform of the voltage difference when the vehicular alternator is in a state of normal power generation is detected to calculate its cycle or period. Thus, ripple detection is carried out by removing a DC component of the vehicular alternator commutating device output. However, the vehicular alternator does not always perform power generation but irregular intermittent power generation. In addition, the number of revolutions per minute of the vehicular alternator depends on that of the engine of a vehicle. For the above-mentioned reasons, the output voltage of the vehicular alternator is varying in accordance with time, and hence, a ripple component due to a change in the operating condition of the engine can not be completely removed by removing a DC component alone. Moreover, since the influence of noise on the ripple component is also large, there is a problem that it is difficult to make a clear distinction between the ripple component due to an engine operating condition change and the ripple voltage resulting from noise or failure. Furthermore, since the output voltage of the vehicular alternator is varying in accordance with time for the reasons as stated above, there is also another problem that it is difficult to obtain an accurate average or mean value upon calculation of an average or mean output voltage of the alternator.

SUMMARY OF THE INVENTION

The present invention is intended to solve the problems as referred to above, and has its object to provide a vehicular alternator failure determination apparatus which is capable of performing failure determination in a very accurate manner.

In order to solve the above-mentioned problems, the present invention provides a vehicular alternator failure determination apparatus in which a difference voltage is detected between a maximum voltage and a minimum voltage of an alternator rectifier or commutating device that serves to rectify or commutate an AC output of an alternator driven by an engine, and in which when the difference voltage is equal to or greater than a predetermined voltage, it is determined that the alternator is in a failure state.

According to one aspect of the present invention, there is provided a vehicular alternator failure determination apparatus which includes: a maximum voltage detection part for detecting a maximum voltage of an alternator commutating device which commutates an AC output of an alternator driven by an engine; a minimum voltage detection part for detecting a minimum voltage of the alternator commutating device; and a voltage difference calculation part for calculating a difference voltage from outputs of the maximum and minimum voltage detection parts. When an output of the voltage difference calculation part is equal to or greater than a prescribed voltage, a failure determination part determines that the alternator is in a failure state.

According to another aspect of the present invention, there is provided a vehicular alternator failure determination apparatus which includes an average voltage calculation part for calculating an average voltage in a prescribed cycle of an output voltage of an alternator commutating device which commutates an AC output of an alternator driven by an engine, and a ripple voltage detection part for detecting the generation of a ripple voltage when a voltage difference between an output voltage of the alternator commutating device and an average voltage thereof in the last cycle becomes equal to or greater than a prescribed ripple determination voltage difference. A ripple voltage counting part counts the number of generations of failure ripple voltages within the prescribed cycle, and a failure location estimation part estimates the location of failure from the number of generations of failure ripple voltages.

The above and other objects, features and advantages of the present invention will become more readily apparent to those skilled in the art from the following detailed description of preferred embodiments of the present invention taken in conjunction with the accompanying drawings.

BRIEF DESCRIPTION OF THE DRAWINGS

FIG. 1 is a block diagram showing the configuration of a vehicular alternator failure determination apparatus according to a first embodiment of the present invention.

DESCRIPTION OF THE PREFERRED EMBODIMENTS

A failure determination apparatus for a vehicular alternator according to the present invention detects a maximum voltage value and a minimum voltage value of a voltage waveform output from the alternator, and detects a ripple voltage waveform, which is actually generated due to a failure of the alternator, from a difference voltage value between the maximum voltage value and the minimum voltage value. In addition, misdetections can be reduced by performing the above operations (i.e., measurements and calculations) in each constant cycle or period or in a cycle or period corresponding to the number of revolutions per minute of the vehicular alternator. Further, in order to perform estimations of a failure location and a failure mode in addition to failure detection, the waveform of a ripple voltage is observed or monitored, and the mode of a failure is estimated. Also, to further decrease misdetections, the operation time of the failure determination apparatus is decided in consideration of the operating condition of the vehicular alternator, the operating condition of the vehicle, and the operation of electric loads therein. According to the vehicular alternator failure determination apparatus of the present invention, it becomes possible to perform failure determinations with less misdetections in comparison with the above-mentioned conventional failure detection technique which is carried out by detecting a ripple voltage waveform and hence is liable to misdetections. Furthermore, it also becomes possible to perform failure detection including estimations of the location and mode of a failure. Hereinafter, preferred embodiments of the present invention will be described in detail while referring to the accompanying drawings.

Embodiment 1.

Figure 2A:
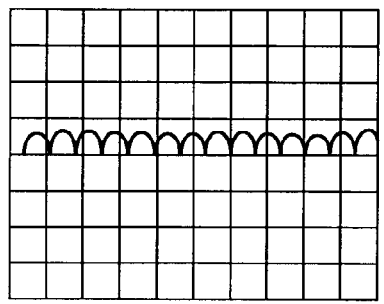
FIGS. 2(a) through 2(e) are views showing the characteristics of a vehicular alternator at the times of normal power generation and the occurrence of failure thereof.
Figure 2B:
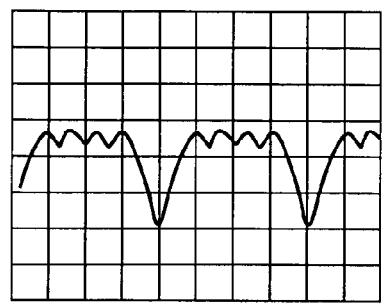
Figure 2C:
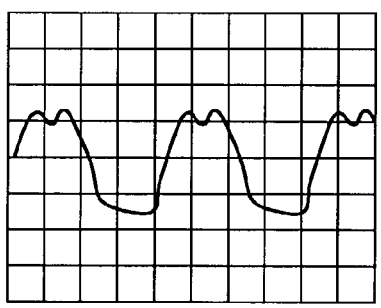
Figure 2D:
Figure 2E:
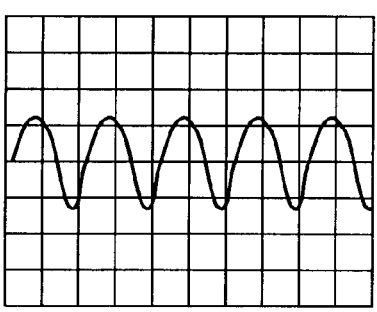

FIG. 1 is a block diagram that shows the configuration of a vehicular alternator failure determination apparatus according to a first embodiment of the present invention. When there is a failure in a commutator element or a stator coil of a vehicular alternator, the waveform of an output voltage of an alternator rectifier or commutating device 100 comes to include a ripple voltage waveform larger than that during normal operation thereof. FIGS. 2(a) through 2(e) show the waveforms of the output voltage of the alternator commutating device 100 at the times of normal operation and failure thereof. FIG. 2(a) shows the case where the alternator is in the state of normal power generation. FIG. 2(b) shows the case where one commutator element is in the state of an open-circuit failure. FIG. 2(c) shows the case where two commutator elements are in the state of an open-circuit failure. FIG. 2(d) shows the case where one commutator element is in the state of a short-circuit failure. FIG. 2(e) shows the case where a stator coil of one phase is in the state of a break failure. The present invention discloses the failure determination apparatus which performs a failure determination of the vehicular alternator by utilizing the above cases.

Figure 16:
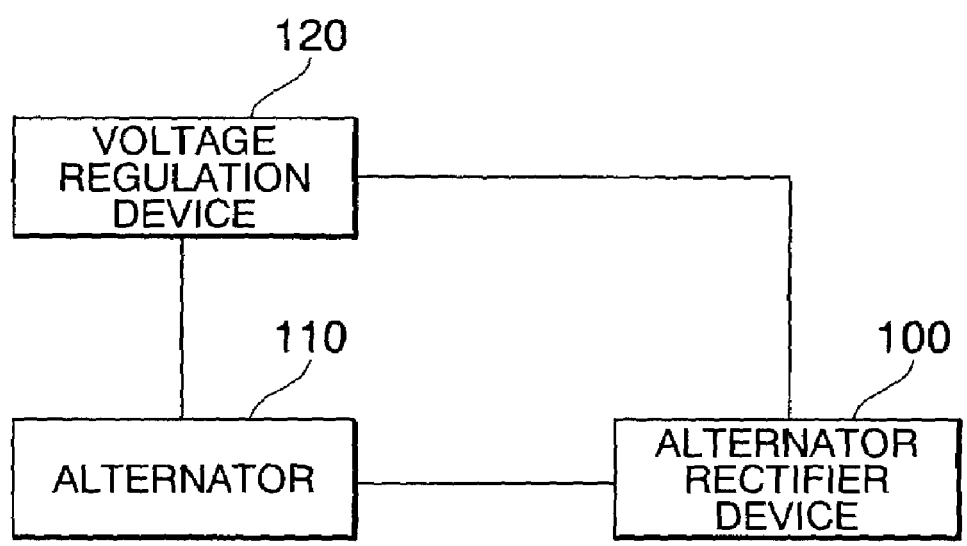
FIG. 16 is a view showing the configuration in a charging system for a vehicle associated with the vehicular alternator failure determination apparatuses of the present invention.

In general, as shown in FIG. 16 for example, the vehicular alternator failure determination apparatus according to the present invention performs prescribed diagnosis processing based on status information that is read out from a charging system of a vehicle which includes an alternator 110 driven by the engine of the vehicle, an alternator rectifier or commutating device 100 for rectifying or commutating an AC output of the alternator 110, and a voltage regulation device 120 for regulating the alternator 110 so that the AC output of the alternator 110 becomes a predetermined value.

In FIG. 1, a maximum voltage detection device 1 detects a maximum voltage Vmax1 of the output voltage of the vehicular alternator rectifier or commutating device 100 input thereto. A minimum voltage detection device 2 detects a minimum voltage Vmin1 of the output voltage of the vehicular alternator commutating device 100 input thereto. These voltage detection devices 1, 2 can be achieved by inputting the output of the vehicular alternator commutating device 100 to a maximum value (or minimum value) hold circuit or an AD (analog to digital) conversion port of a microcomputer. A voltage difference calculation device 3 detects a difference Vdiff1 between an output Vmax1 of the maximum voltage detection device 1 and an output Vmin1 of the minimum voltage detection device 2. The voltage difference calculation device 3 can be achieved by an analog subtraction circuit or an arithmetic unit in the microcomputer to whose AD (analog to digital) conversion ports the outputs of the maximum voltage detection device 1 and the minimum voltage detection device 2 are input, respectively. A failure determination device 4 compares the output Vdiff1 of the voltage difference calculation device 3 with a prescribed failure determination threshold voltage Vth1, and makes a failure determination (i.e., the vehicular alternator is in a failure state) when the output Vdiff1 of the voltage difference calculation device 3 is equal to or greater than the prescribed failure determination threshold voltage Vth1 (see expression (1) below).

$$V\text{diff1} = V\text{max1} - V\text{min1} \geq V\text{th1} \qquad (1)$$

Here, note that the vehicular alternator failure determination apparatus according to the first embodiment can be constructed by a microcomputer, and in this case, the devices 1 through 4 of FIG. 1 comprise corresponding functional blocks in the microcomputer including a memory M of FIG. 1.

Figure 3:
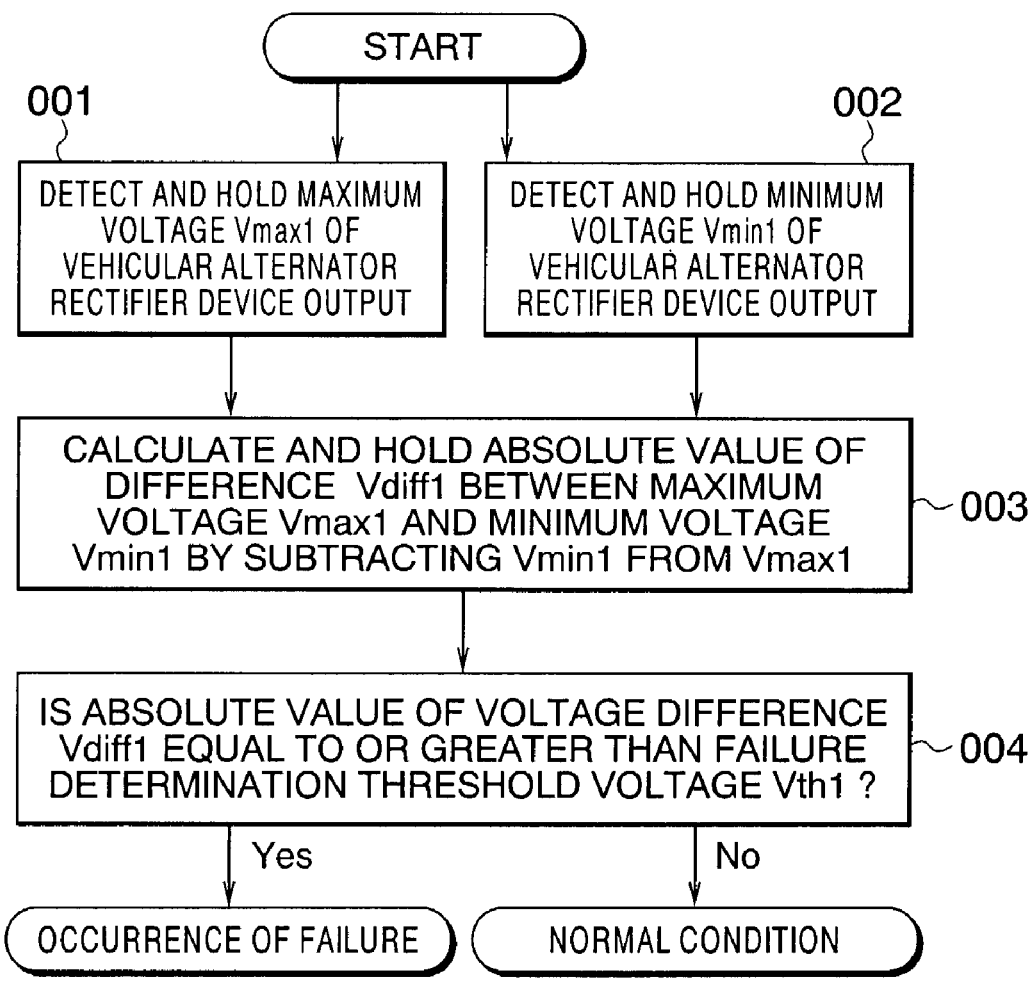
FIG. 3 is a flow chart explaining the operation of the vehicular alternator failure determination apparatus according to the first embodiment of the present invention.

FIG. 3 shows a flow chart of the operation of this embodiment. In step 001, as shown in FIG. 1 for instance, the maximum voltage Vmax1 of the output voltage of the vehicular alternator rectifier or commutating device 100 is measured as the output Valt of the vehicular alternator 110 in operation, stored in a memory (M in FIG. 1) or held by a maximum value hold circuit (1 in FIG. 1). Similarly, in step 002, the minimum voltage Vmin1 of the output voltage of the alternator commutating device 100 is measured as the output Valt of the vehicular alternator 110 in operation, and stored in the memory or held by a minimum value hold circuit (2 in FIG. 1). In step 003, the difference Vdiff1 (absolute value) between the maximum voltage Vmax1 of the alternator commutating device output measured in step 001 and the minimum voltage Vmin1 of the alternator commutating device output measured in step 002 is calculated and stored in the memory or output in analog form. In step 004, the voltage difference Vdiff1 calculated in step 003 is compared with the prescribed failure determination threshold voltage Vth1, and when the voltage difference calculation device output Vdiff1 is equal to or greater than the failure determination threshold voltage Vth1, it is determined that the vehicular alternator is in a failure state.

In this first embodiment, a voltage reduction or drop upon failure of the vehicular alternator is not detected as an absolute voltage value, but as a difference between the maximum voltage and the minimum voltage, and hence it is possible to reduce misdetections. Moreover, in cases where a voltage reduction or drop is detected by an absolute voltage value, it is impossible to detect not only such a voltage reduction but also an overcharge even if such a situation takes place. However, the detection of such an overcharge as well as an abnormal voltage reduction becomes possible in the first embodiment by detecting the magnitude of a voltage difference between the maximum voltage and the minimum voltage.

Embodiment 2.

Figure 4:
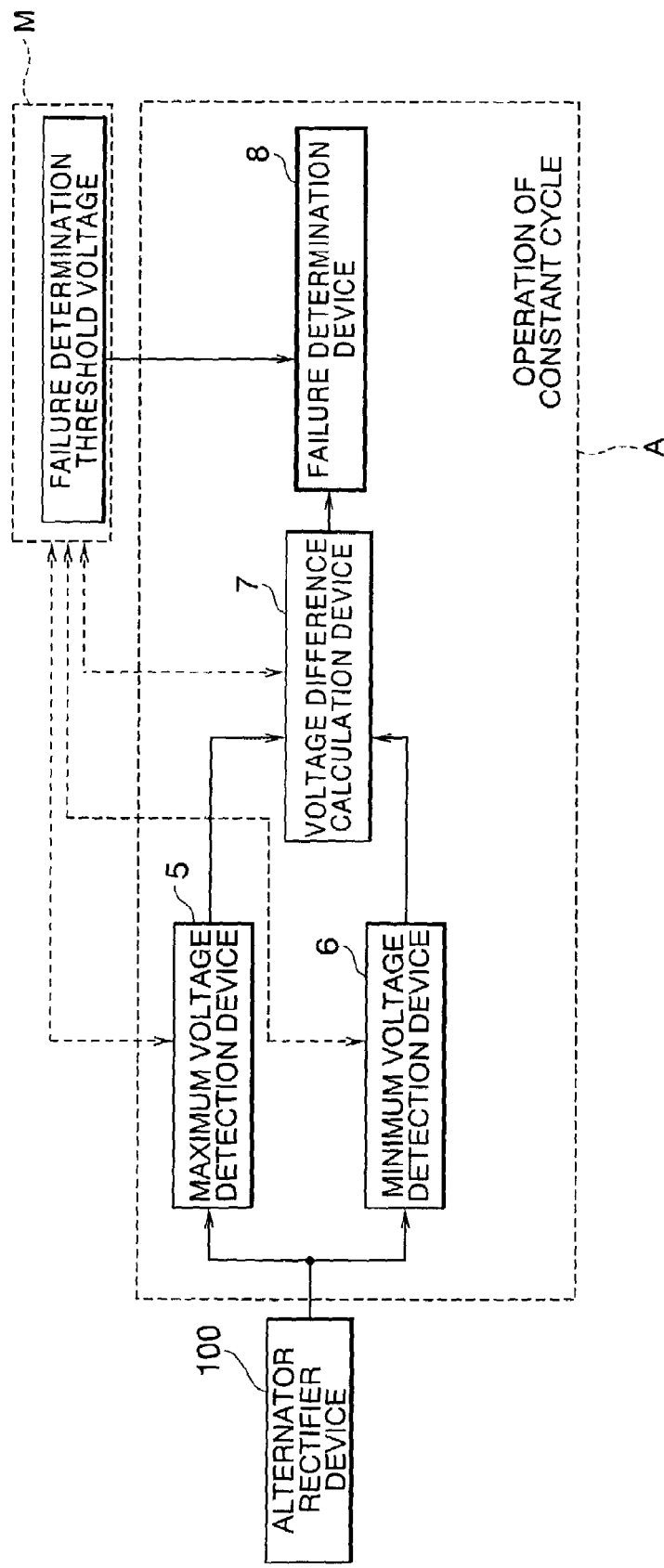
FIG. 4 is a view showing the configuration of a vehicular alternator failure determination apparatus according to a second embodiment of the present invention.

FIG. 4 is a block diagram that shows the configuration of a vehicular alternator failure determination apparatus according to a second embodiment of the present invention. In this embodiment, similar to the above-mentioned first embodiment, a determination of failure of a vehicular alternator is made by utilizing the fact that when there is a failure in a commutator element or a stator coil of the vehicular alternator, the waveform of an output voltage of a rectifier or commutating device comes to include a ripple voltage waveform larger than that during normal operation thereof, as shown in FIGS. 2(a) through 2(e).

In FIG. 4, a reference symbol A designates a constant cycle operation function that operates respective devices 5 through 8 at a prescribed cycle or period, that is, provides a synchronization signal to the respective devices 5 through 8 so as to make them operate at the constant cycle or period, if they are hardware, as shown in the following embodiments for instance. The maximum voltage detection device 5 detects a maximum voltage Vmax2 of the output voltage of a vehicular alternator rectifier or commutating device 100 which is input thereto within a designated cycle or period. The minimum voltage detection device 6 detects a minimum voltage Vmin2 of the output voltage of the vehicular alternator commutating device 100 which is input thereto within the designated cycle or period. These voltage detection devices 5, 6 can be achieved by inputting the output of the vehicular alternator commutating device 100 to a maximum value (or minimum value) hold circuit with a reset circuit or an AD (analog to digital) conversion port of a microcomputer. The voltage difference calculation device 7 detects a difference Vdiff2 between the output Vmax2 of the maximum voltage detection device 5 and the output Vmin2 of the minimum voltage detection device 6. The voltage difference calculation device 7 can be achieved by an analog subtraction circuit or an arithmetic unit in the microcomputer to whose AD (analog to digital) conversion ports the outputs of the maximum voltage detection device 5 and the minimum voltage detection device 6 are input, respectively. The failure determination device 8 compares the output Vdiff2 of the voltage difference calculation device 7 with a prescribed failure determination threshold voltage Vth2 in each cycle, and makes a failure determination when the output Vdiff2 of the voltage difference calculation device 7 is equal to or greater than the prescribed failure determination threshold voltage Vth2(see expression (2) below).

$$V\text{diff2}=V\text{max2}-V\text{min2} \geq V\text{th2} \qquad (2)$$

Here, note that the vehicular alternator failure determination apparatus according to the second embodiment can be constructed by a microcomputer, and in this case, the devices 5 through 8 of FIG. 4 comprise corresponding functional blocks in the microcomputer including a memory M.

Figure 5:
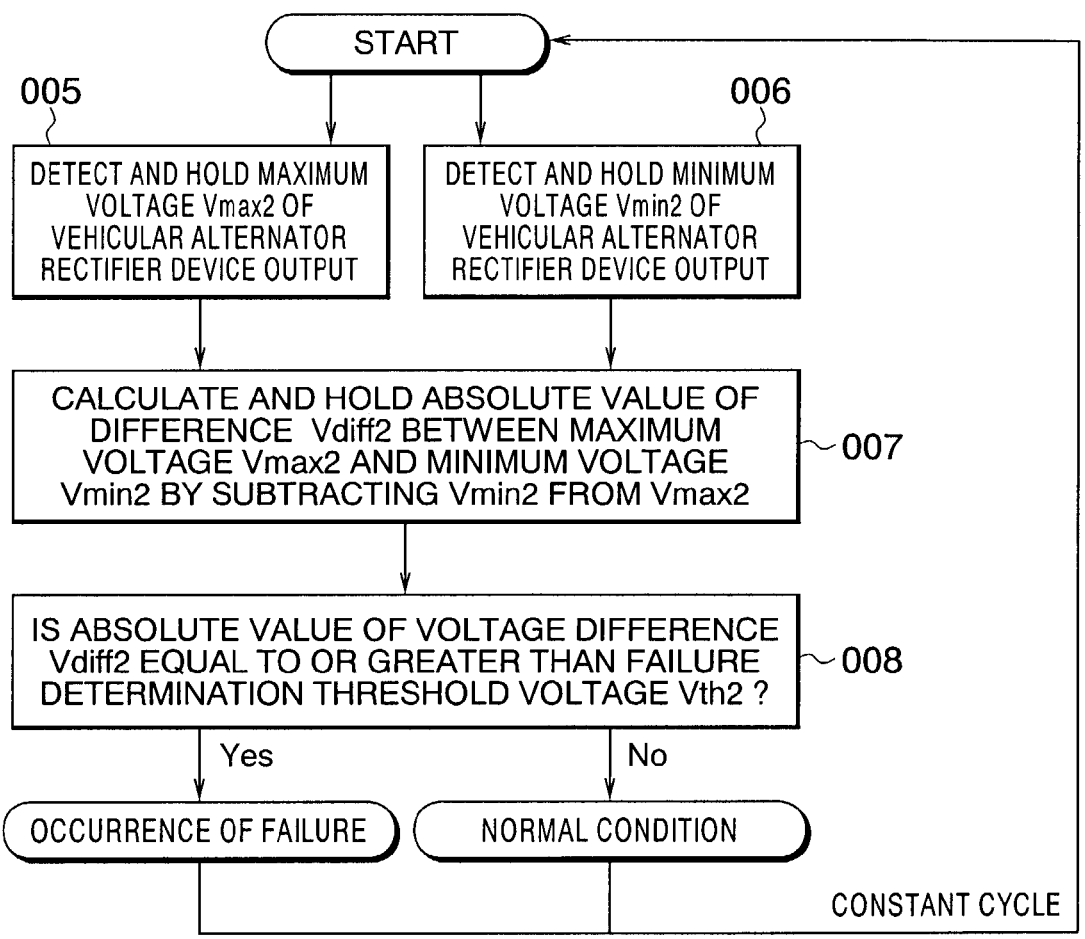
FIG. 5 is a flow chart explaining the operation of the vehicular alternator failure determination apparatus according to the second embodiment of the present invention.

FIG. 5 shows a flow chart of the operation of this second embodiment. In step 005, the maximum voltage Vmax2 of the vehicular alternator rectifier or commutating device output in the predetermined cycle, which is the output Valt of the vehicular alternator 100 in operation, is measured and stored in a memory (M in FIG. 4) or held by a maximum value hold circuit (5 in FIG. 4). Similarly, in step 006, the minimum voltage Vmin2 of the output voltage of the alternator commutating device 100 in operation in the predetermined cycle is measured and stored in the memory or held by a minimum value hold circuit (6 in FIG. 4). In step 007, the difference Vdiff2(absolute value) between the maximum voltage Vmax2 of the alternator commutating device output measured in the prescribed cycle in step 005 and the minimum voltage Vmin2 of the alternator commutating device output measured in the prescribed cycle in step 006 is calculated and stored in the memory or output in analog form. In step 008, the voltage difference Vdiff2 calculated in step 007 is compared with the prescribed failure determination threshold voltage Vth2, and when the voltage difference calculation device output Vdiff2 is equal to or greater than the failure determination threshold voltage Vth2, a failure determination is made.

In the second embodiment, by detecting the maximum voltage and the minimum voltage of the vehicular alternator output in a short cycle, it is possible to prevent failure misdetections, which would otherwise be caused by a large voltage difference between the maximum voltage and the minimum voltage due to variations or fluctuations in the average or mean voltage generated upon engine starting or the like.

Embodiment 3.

Figure 6:
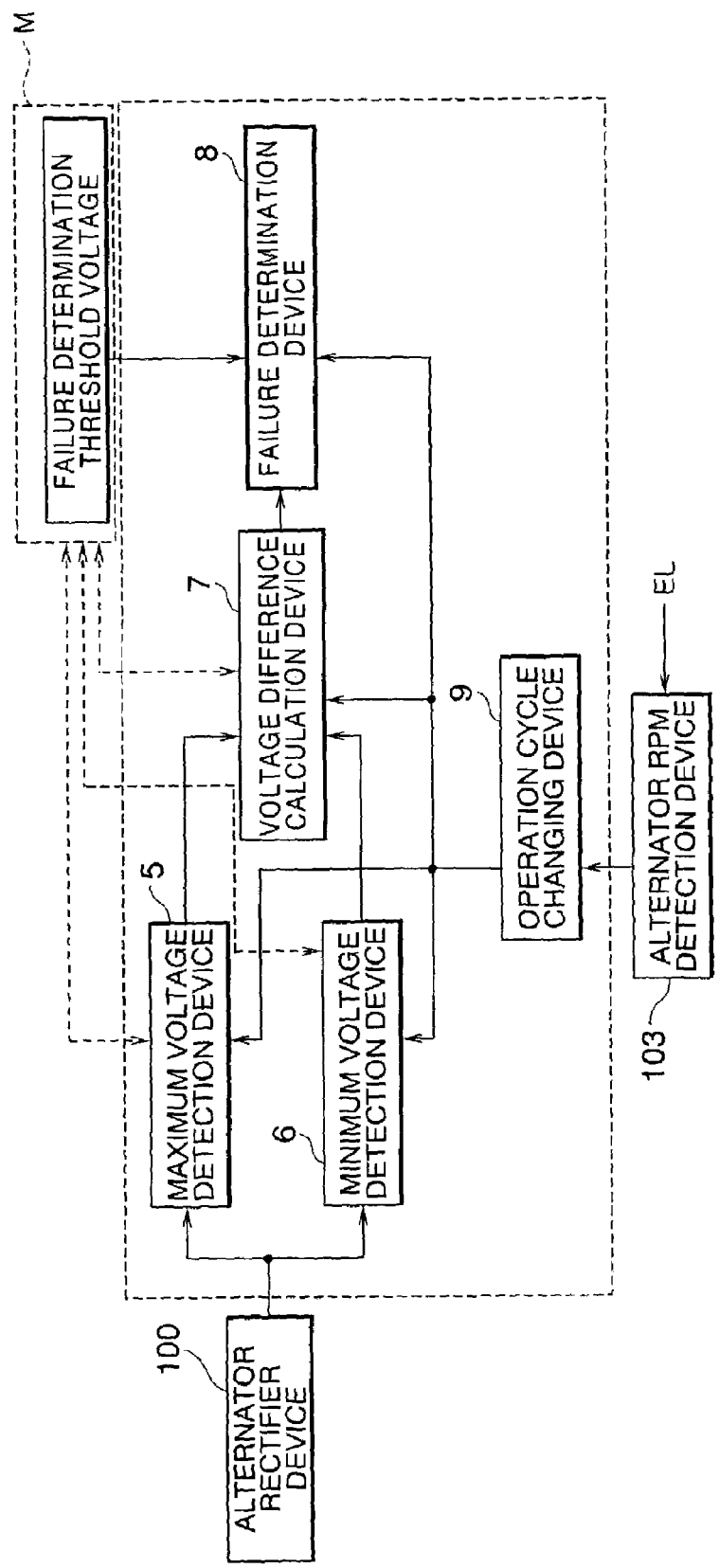
FIG. 6 is a view showing the configuration of a vehicular alternator failure determination apparatus according to a third embodiment of the present invention.

FIG. 6 is a block diagram that shows the configuration of a vehicular alternator failure determination apparatus according to a third embodiment of the present invention. In this embodiment, a determination of failure of a vehicular alternator is made by utilizing the fact that when there is a failure in a commutator element or a stator coil of the vehicular alternator, the waveform of an output voltage of a rectifier or commutating device comes to include a ripple voltage waveform larger than that during normal operation thereof, as shown in FIGS. 2(*a*) through 2(*e*). An operation cycle changing device 9 changes the operation cycle of the vehicular alternator failure determination apparatus in accordance with the operating condition of a vehicle or the operating condition of the vehicular alternator.

In FIG. 6, the operation cycle changing device 9 detects the number of revolutions per minute of the vehicular alternator as the operating condition of the vehicle by means of a vehicular alternator rpm detection device 103, and determines the operation cycle of the vehicular alternator failure determination apparatus in accordance with the number of revolutions per minute of the vehicular alternator thus detected. The vehicular alternator rpm detection device 103 can be realized by estimating the number of revolutions per minute of the vehicular alternator from the number of revolutions per minute of the engine (engine rpm) EL or by using a magnetic sensor or the like. Here, note that instead of providing the vehicular alternator rpm detection device 103, the number of revolutions per minute of the vehicular alternator may be directly input from the outside to the operation cycle changing device 9 (this may also be similarly applied to the case where the vehicular alternator failure determination apparatus is constructed by a microcomputer). A maximum voltage detection device 5 detects a maximum voltage Vmax3 of the output voltage of a vehicular alternator rectifier or commutating device 100 which is input thereto within a cycle or period designated by the operation cycle changing device 9. A minimum voltage detection device 6 detects a minimum voltage Vmin3 of the output voltage of the vehicular alternator commutating device 100 which is input thereto within the cycle or period designated by the operation cycle changing device 9. These voltage detection devices 5, 6 can be achieved by inputting the output of the vehicular alternator commutating device 100 to a maximum value (or minimum value) hold circuit with a reset circuit or an AD (analog to digital) conversion port of a microcomputer.

A voltage difference calculation device 7 detects a difference Vdiff3 between the output Vmax3 of the maximum voltage detection device 5 and the output Vmin3 of the minimum voltage detection device 6. The voltage difference calculation device 7 can be achieved by an analog subtraction circuit or an arithmetic unit in the microcomputer to whose AD (analog to digital) conversion ports the outputs of the maximum voltage detection device 5 and the minimum voltage detection device 6 are input, respectively. A failure determination device 8 compares the output Vdiff3 of the voltage difference calculation device 7 with a prescribed failure determination threshold voltage Vth3 in a cycle designated by the operation cycle changing device 9, and makes a failure determination when the output Vdiff3 of the voltage difference calculation device 7 is equal to or greater than the prescribed failure determination threshold voltage Vth3 (see expression (3) below).

$$V\text{diff3} = V\text{max3} - V\text{min3} \geq V\text{th3} \quad (3)$$

Here, note that the vehicular alternator failure determination apparatus according to the third embodiment can be constructed by a microcomputer, and in this case, the devices 5 through 9 of FIG. 6 further including, if necessary, the alternator rpm detection device 103 comprise corresponding functional blocks in the microcomputer including a memory M.

Figure 7:
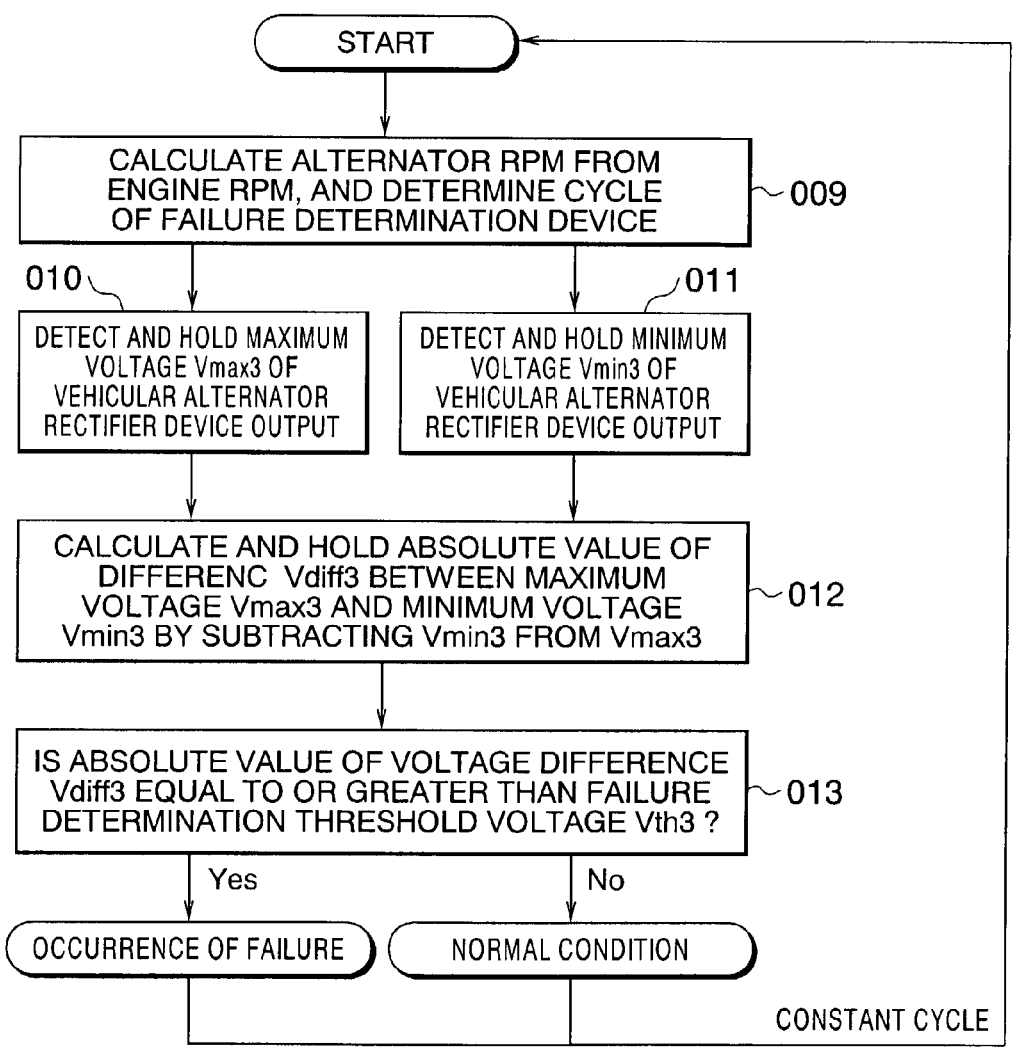
FIG. 7 is a flow chart explaining the operation of the vehicular alternator failure determination apparatus according to the third embodiment of the present invention.

FIG. 7 shows a flow chart of the operation of this third embodiment. In step 009, the operation cycle of the vehicular alternator failure determination apparatus is decided based on the number of revolutions per minute of the vehicular alternator which is obtained from information such as the number of revolutions per minute of the engine, etc. In step 010, the maximum voltage Vmax3 of the vehicular alternator rectifier or commutating device output in operation in the cycle decided in step 009 for example is measured as the vehicular alternator output Valt, and stored in a memory (M in FIG. 6) or held by a maximum value hold circuit (5 in FIG. 6). Similarly, in step 011, the minimum voltage Vmin3 of the output voltage of the alternator commutating device 100 in operation in the cycle decided in step 009 is measured and stored in the memory or held by a minimum value hold circuit (6 in FIG. 6). In step 012, the difference Vdiff3 (absolute value) between the maximum voltage Vmax3 of the alternator commutating device output measured in step 010 in the cycle decided in step 009 and the minimum voltage Vmin3 of the alternator commutating device output measured in step 011 in the cycle decided in step 009 is calculated and stored in the memory or output in analog form. In step 013, the voltage difference Vdiff3 calculated in step 012 is compared with the prescribed failure determination threshold voltage Vth3, and when the voltage difference calculation device output Vdiff3 is equal to or greater than the failure determination threshold voltage Vth3, a failure determination (the vehicular alternator is in a failure state) is made.

In the third embodiment, the maximum voltage and the minimum voltage of the vehicular alternator output are measured in a long cycle when the number of revolutions per minute of the vehicular alternator is low, whereas the maximum voltage and the minimum voltage of the vehicular alternator are measured in a short cycle when the number of revolutions per minute of the vehicular alternator is high. As a result, even when the number of revolutions per minute of the vehicular alternator is low, it becomes possible to perform failure determination in a reliable manner without failing to pick up any ripple waveform.

Embodiment 4.

Figure 8:
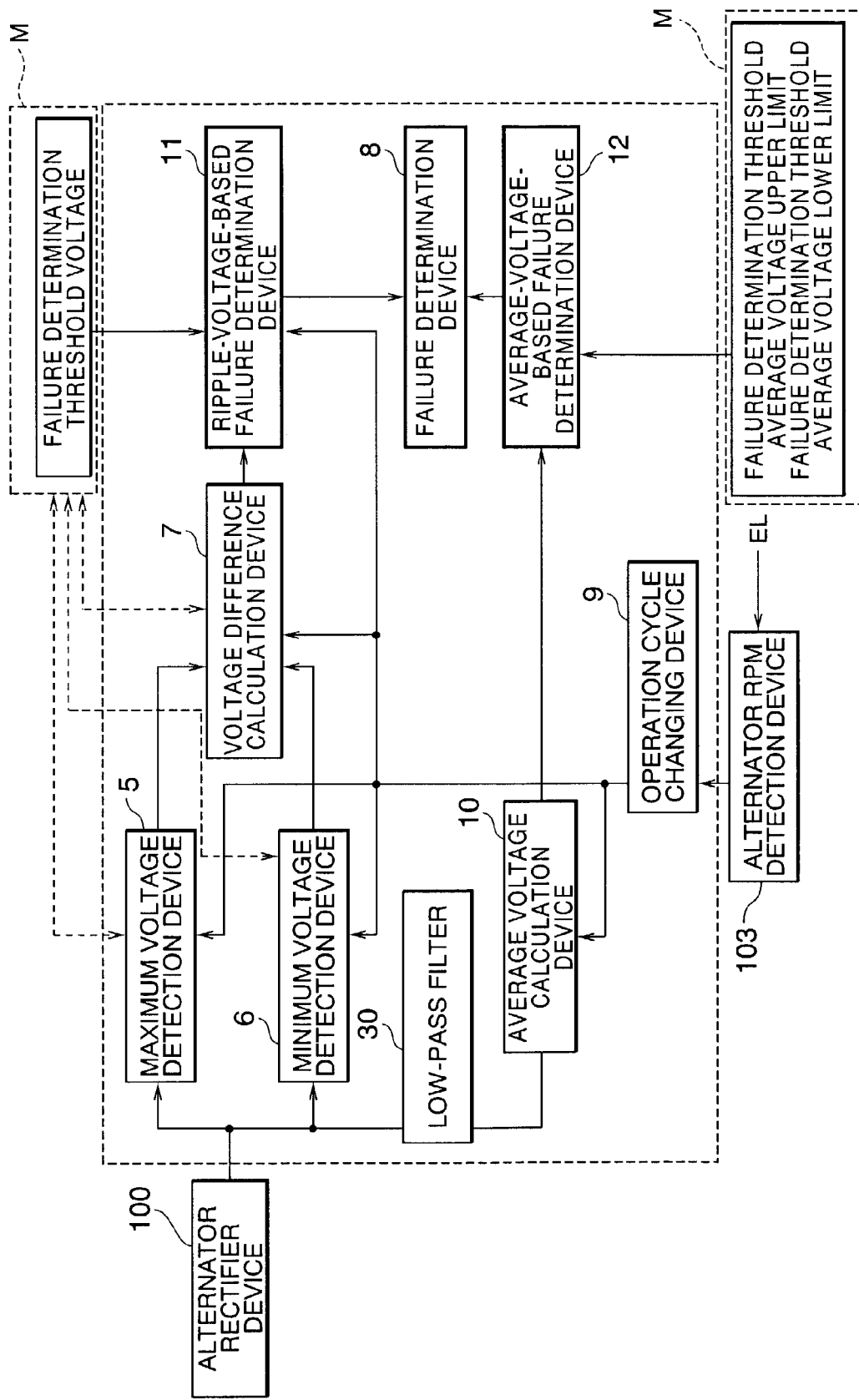
FIG. 8 is a view showing the configuration of a vehicular alternator failure determination apparatus according to a fourth embodiment of the present invention.

FIG. 8 is a block diagram that shows the configuration of a vehicular alternator failure determination apparatus according to a fourth embodiment of the present invention. In this embodiment, a determination of failure of a vehicular alternator is made by utilizing the facts that when there is a failure in a commutator element or a stator coil of the vehicular alternator, the waveform of an output voltage of a rectifier or commutating device comes to include a ripple voltage waveform larger than that during normal operation thereof, and that when there is a failure in a field coil or a voltage regulation device, the output voltage of the commutating device is greatly deviated from a predetermined voltage, as shown in FIGS. 2(*a*) through 2(*e*). An operation cycle changing device 9 changes the operation cycle of the vehicular alternator failure determination apparatus in accordance with the operating condition of a vehicle or the operating condition of the vehicular alternator.

In FIG. 8, the operation cycle changing device 9 detects the number of revolutions per minute of the vehicular alternator as the operating condition of the vehicle by means of a vehicular alternator rpm detection device 103, and determines the operation cycle of the vehicular alternator failure determination apparatus in accordance with the number of revolutions per minute of the vehicular alternator thus detected. The vehicular alternator rpm detection device 103 can be realized by estimating the number of revolutions per minute of the vehicular alternator from the number of revolutions per minute of the engine (engine rpm) EL or by using a magnetic sensor or the like. A maximum voltage detection device 5 detects a maximum voltage Vmax4 of the output voltage of a vehicular alternator rectifier or commutating device 100 which is input thereto within a cycle or period designated by the operation cycle changing device 9. A minimum voltage detection device 6 detects a minimum voltage Vmin4 of the output voltage of the vehicular alternator commutating device 100 which is input thereto within the cycle or period designated by the operation cycle changing device 9. These voltage detection devices 5, 6 can be achieved by inputting the output of the vehicular alternator commutating device 100 to a maximum value (or minimum value) hold circuit with a reset circuit or an AD (analog to digital) conversion port of a microcomputer.

A voltage difference calculation device 7 detects a difference Vdiff4 between the output Vmax4 of the maximum voltage detection device 5 and the output Vmin4 of the minimum voltage detection device 6. The voltage difference calculation device 7 can be achieved by an analog subtraction circuit or an arithmetic unit in a microcomputer to whose AD (analog to digital) conversion ports the outputs of the maximum voltage detection device 5 and the minimum voltage detection device 6 are input, respectively. A ripple-voltage-based failure determination device 11 for performing a failure determination based on a ripple voltage compares the output Vdiff4 of the voltage difference calculation device 7 and a prescribed failure determination threshold voltage Vth4 in a cycle or period designated by the operation cycle changing device 9, and makes a failure determination when the output Vdiff4 of the voltage difference calculation device 7 is equal to or greater than the prescribed failure determination threshold voltage Vth4 (see expression (4) below).

$$Vdiff4 = Vmax4 - Vmin4 \geq Vth4 \quad (4)$$

In addition, an average voltage calculation device 10 calculates an average or mean voltage Vave4 of the output of the vehicular alternator commutating device 100 which has passed a low-pass filter 30 within a cycle designated by the operation cycle changing device 9. The average voltage calculation device 10 can be realized by a low-pass filter circuit and an average or mean voltage calculation function of the microcomputer. An average-voltage-based failure determination device 12 for performing a failure determination based on an average or mean voltage compares the output of the average voltage calculation device 10 with a prescribed failure determination threshold average voltage upper limit Vth top4 and a prescribed failure determination threshold average voltage lower limit Vth bot4 in a cycle designated by the operation cycle changing device 9. When the average voltage Vave4 is equal to or greater than the failure determination threshold average voltage upper limit Vth top4, or equal to or less than from the failure determination threshold average voltage lower limit Vth bot4 (see expression (5) below), it is determined that the voltage regulation device of the vehicular alternator is in a failure state.

$$Vave4 \geq Vth\ top4 \text{ or } Vave4 < Vth\ bot4 \quad (5)$$

Here, note that the vehicular alternator failure determination apparatus according to the fourth embodiment can be constructed by a microcomputer. and in this case, the devices 5 through 12 of FIG. 8 further including, if necessary, the alternator rpm detection device 103 comprise corresponding functional blocks in the microcomputer including a memory M.

Figure 9:
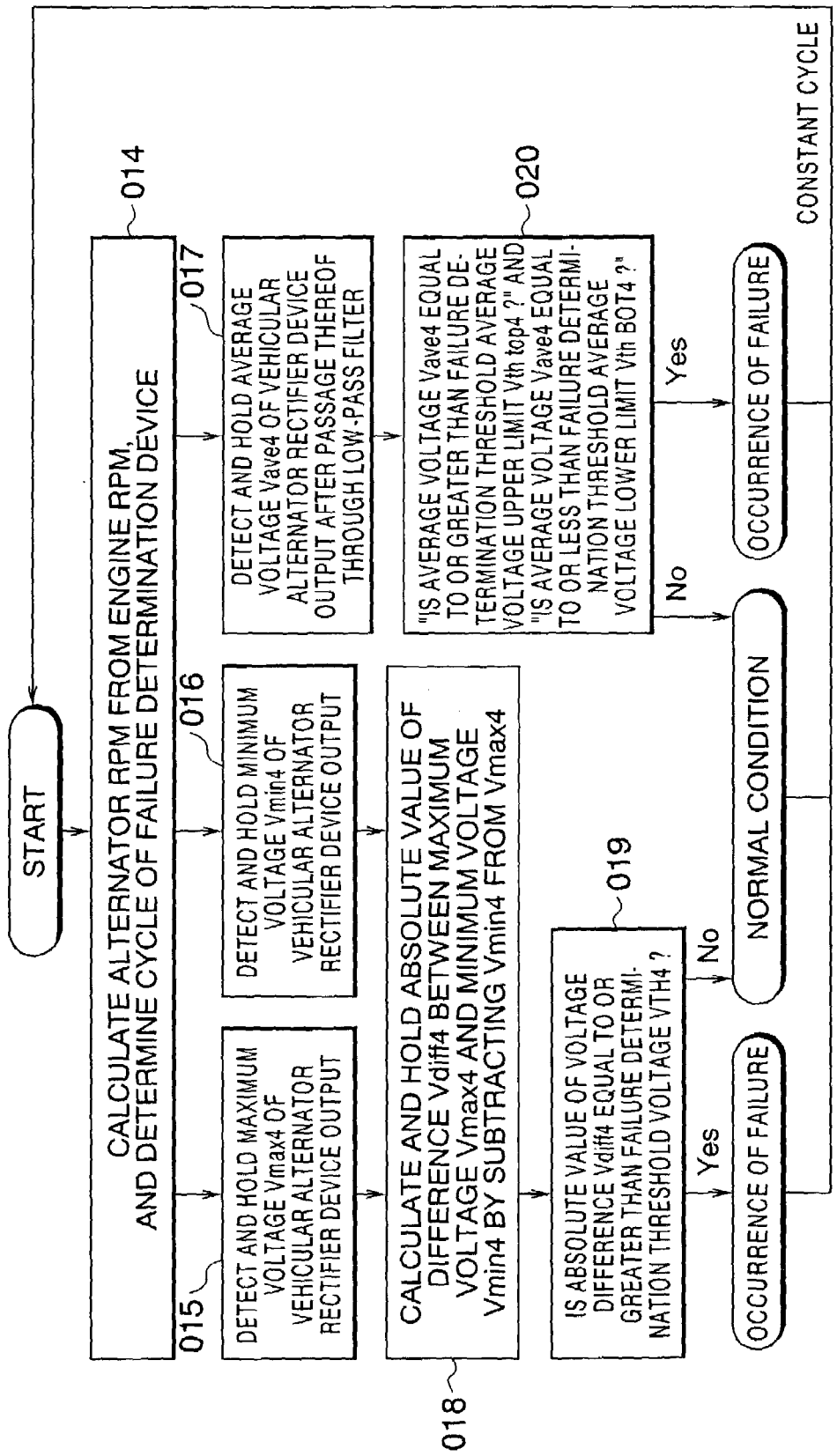
FIG. 9 is a flow chart explaining the operation of the vehicular alternator failure determination apparatus according to the fourth embodiment of the present invention.

FIG. 9 shows a flow chart of the operation of this fourth embodiment. In step 014, the operation cycle of the vehicular alternator failure determination apparatus in operation is decided based on the number of revolutions per minute of the vehicular alternator which is obtained from information such as the number of revolutions per minute of the engine, etc. In step 015, for example, the maximum voltage Vmax4 of the vehicular alternator rectifier or commutating device output in the cycle decided in step 014 is measured as the output Valt of the vehicular alternator 100, and stored in a memory (M in FIG. 8) or held by a maximum value hold circuit (5 in FIG. 8). Similarly, in step 016, the minimum voltage Vmin4 of the vehicular alternator commutating device output in the cycle decided in step 014 is measured and stored in the memory (M in FIG. 8) or held by a minimum value hold circuit (6 in FIG. 8). In step 018, the difference Vdiff4 (absolute value) between the maximum voltage Vmax4 of the alternator commutating device output measured in step 015 in the cycle decided in step 014 and the minimum voltage Vmin4 of the alternator commutating device output measured in step 016 in the cycle decided in step 014 is calculated and stored in the memory or output in analog form. In step 019, the voltage difference Vdiff4 calculated in step 018 is compared with the prescribed failure determination threshold voltage Vth4, and when the voltage difference calculation device output Vdiff4 is equal to or greater than the failure determination threshold voltage Vth4, a failure determination is made.

In step 017, the vehicular alternator output Valt (here, the average or mean voltage Vave4 of the alternator commutating device output having passed the low-pass filter) in the cycle decided in step 014 is calculated and stored in the memory. In step 020, the average or mean voltage Vave4 of the vehicular alternator output calculated in step 014 is compared with the prescribed failure determination threshold voltage range upper limit Vth top4 and the prescribed failure determination threshold voltage range lower limit Vth bot4. When the average or mean voltage Vave4 is equal to or greater than the failure determination threshold voltage range upper limit Vth top4, or equal to or less than the failure determination threshold voltage range lower limit Vth bot4, a failure determination is made.

In this fourth embodiment, in addition to the failure determination of the commutator elements and the stator coil of the vehicular alternator based on the difference between the maximum voltage and the minimum voltage of the ripple voltage waveform of the vehicular alternator output, it is possible to perform the failure determination of the field coil and the voltage regulation device of the vehicular alternator by measuring the average or mean voltage within a determination cycle corresponding to the number of revolutions per minute of the vehicular alternator.

Embodiment 5.

Figure 10:
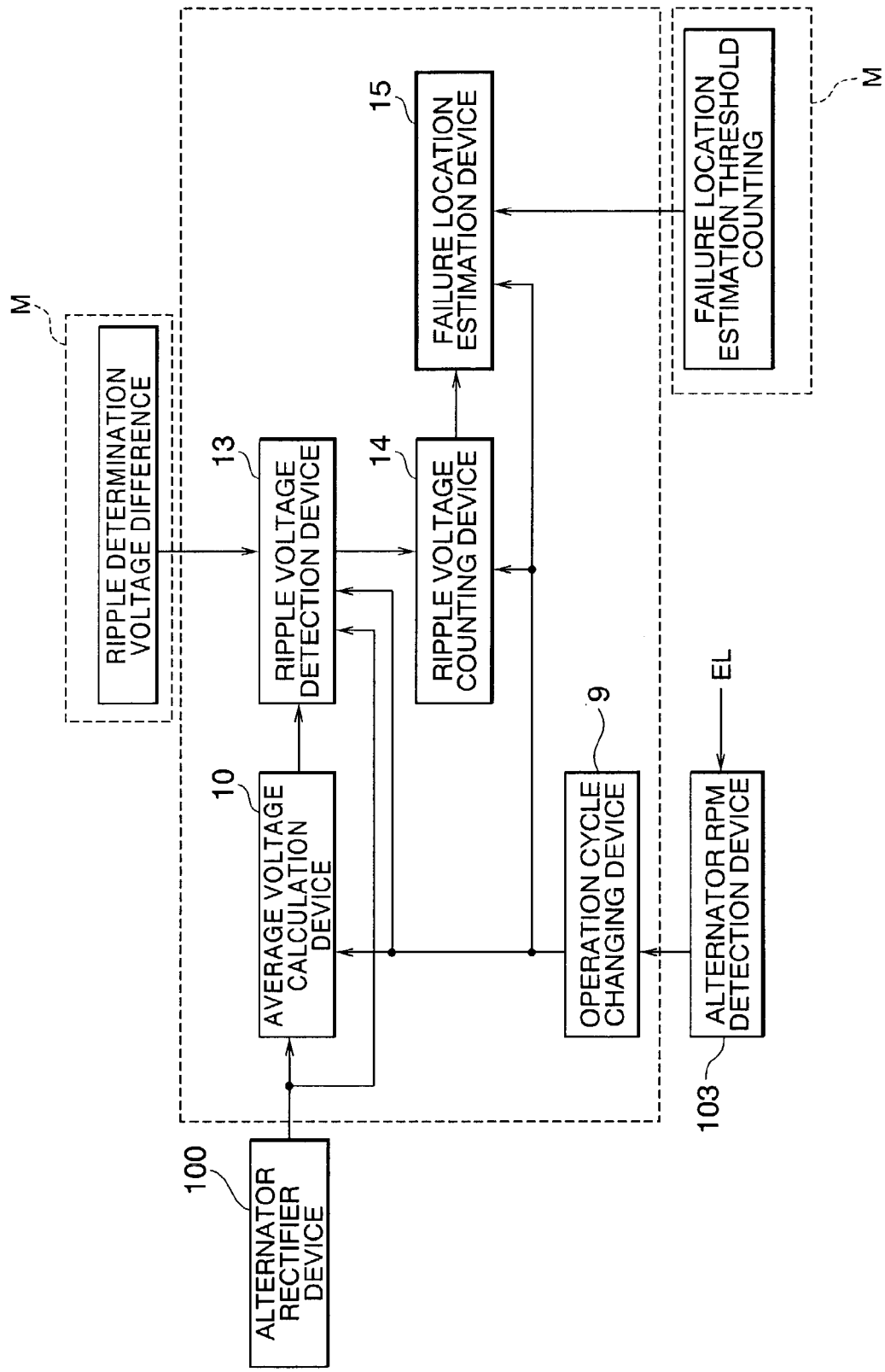
FIG. 10 is a view showing the configuration of a vehicular alternator failure determination apparatus according to a fifth embodiment of the present invention.

FIG. 10 is a block diagram that shows the configuration of a vehicular alternator failure determination apparatus according to a fifth embodiment of the present invention. In this embodiment, failure determinations and estimations of failure locations of a vehicular alternator are carried out by utilizing the facts that when there is a failure in a commutator element or a stator coil of the vehicular alternator, the waveform of an output voltage of a rectifier or commutating device comes to include a ripple voltage waveform larger than that during normal operation thereof, and that the numbers of generations of ripple voltages contained in the output voltage waveform of the commutating device at the same rpm and within the same cycle of the vehicular alternator are different between when there is a failure in the commutating device and when there is a failure in the stator coil, as shown in FIGS. 2(a) through 2(e).

In FIG. 10, an operation cycle changing device 9 changes the operation cycle of the vehicular alternator failure determination apparatus in accordance with the operating condition of a vehicle or the operating condition of the vehicular alternator. The operation cycle changing device 9 detects the number of revolutions per minute of the vehicular alternator as the operating condition of the vehicle by means of a vehicular alternator rpm detection device 103, and determines the operation cycle of the vehicular alternator failure determination apparatus in accordance with the number of revolutions per minute of the vehicular alternator thus detected. The alternator rpm detection device 103 can be realized by estimating the number of revolutions per minute of the vehicular alternator from the number of revolutions per minute of the engine (engine rpm) EL or by using a magnetic sensor or the like. An average voltage calculation device 10 calculates an average or mean voltage Vave5 in the cycle designated by the operation cycle changing device 9. The average voltage calculation device 10 is realizable in a microcomputer. A ripple voltage detection device 13 subtracts the last cycle (i.e., one cycle before) average or mean voltage Vave5' from the output Valt5 of the average voltage calculation device 10, calculates the absolute value of the difference thus obtained, and detects it as a ripple voltage when the absolute value of the voltage difference exceeds a prescribed ripple determination voltage difference Vth5 (see expression (6) below).

$$|Valt5 - Vave5'| \geq Vth5 \quad (6)$$

The ripple voltage detection device 13 can be realized by using a comparator circuit, or a microcomputer, an absolute value circuit and a subtraction circuit, etc. A ripple voltage counting device 14 counts the number of generations of ripple voltages detected by the ripple voltage detection device 13 within the operation cycle decided by the operation cycle changing device 9. The ripple voltage counting device 14 can be realized by a counter circuit with a reset circuit or a microcomputer. A failure location estimation device 15 compares an output Srip5 of the ripple voltage counting device 14 with a prescribed failure location estimation threshold count Sth5, and makes failure determinations in the following manner. That is, when the ripple voltage counting device output is equal to or greater than the failure location estimation threshold count (see expression (7) below), it is determined that the stator coil of the vehicular alternator is in a failure state, whereas when the ripple voltage counting device output Srip5 is equal to or less than the prescribed failure location estimation threshold count Sth5 (see expression (8) below), it is determined that the commutating device of the vehicular alternator is in a failure state.

$$Srip5 \geq Sth5 \quad (7)$$

$$Srip5 \leq Sth5 \quad (8)$$

Here, note that the vehicular alternator failure determination apparatus according to the fifth embodiment can be constructed by a microcomputer, and in this case, the devices 9, 10, and 13 through 15 of FIG. 10 further including, if necessary, the alternator rpm detection device 103 comprise corresponding functional blocks in the microcomputer including a memory M.

Figure 11:
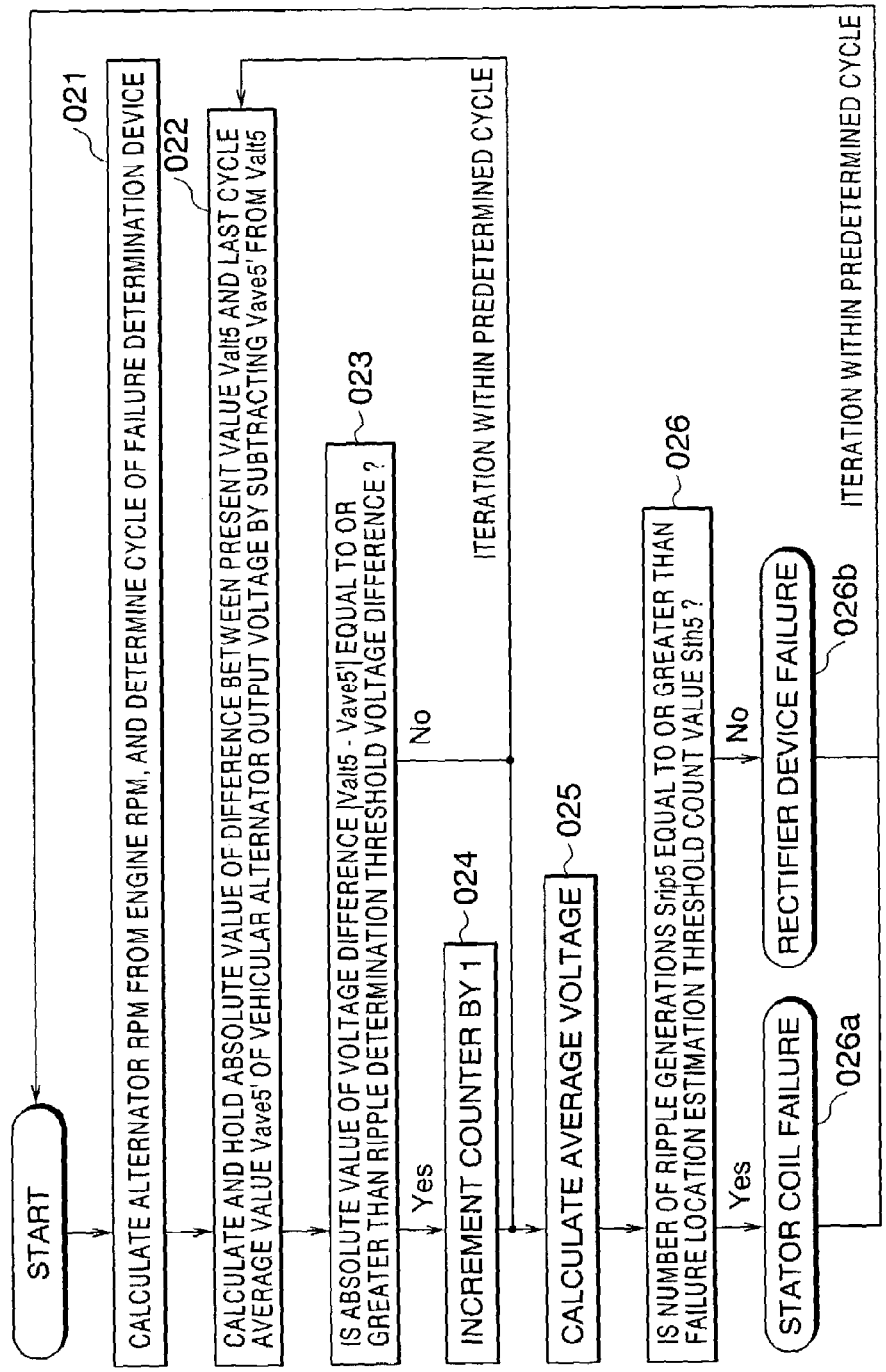
FIG. 11 is a flow chart explaining the operation of the vehicular alternator failure determination apparatus according to the fifth embodiment of the present invention.

FIG. 11 shows a flow chart of the operation of this fifth embodiment. In step 021, the operation cycle of the vehicular alternator failure determination apparatus is decided based on the number of revolutions per minute of the vehicular alternator which is obtained from information such as the number of revolutions per minute of the engine, etc. In step 022, the last cycle average voltage Vave5' is subtracted from the vehicular alternator rectifier or commutating device output Valt5 (e.g., the output of the alternator commutating device 100 of FIG. 10 is actually used), and the absolute value of the difference thus obtained is calculated and stored in a memory (M in FIG. 10) or held by a hold circuit (13 in FIG. 10). In step 023, the voltage difference absolute value calculated in step 022 is compared with the prescribed ripple determination voltage difference Vth5, and when the voltage difference absolute value becomes equal to or greater than the ripple determination voltage difference Vth5, the counter or ripple voltage counting device 14 is incremented by 1 in step 024. In step 025, an average or mean value of the vehicular alternator commutating device output in the cycle decided in step 021 is calculated. In step 026, the number of ripple voltage generations Srip5 counted in step 025 is compared with the prescribed failure location estimation threshold count Sth5. When the number of ripple voltage generations Srip5 is equal to or greater than the failure location estimation threshold count Sth5, it is determined that the stator coil of the vehicular alternator is in a failure state (step 026a), whereas when the number of ripple voltage generations Srip5 is less than the failure location estimation threshold count Sth5, it is determined that the commutating device is in a failure state (step 026b).

In this fifth embodiment, in addition to performing a failure determination of the vehicular alternator as a whole, it becomes possible to estimate a failure of the commutating device and a failure of the stator coil of the vehicular alternator by observing or monitoring the waveform of ripple voltages caused by such failures.

Embodiment 6.

Figure 12:
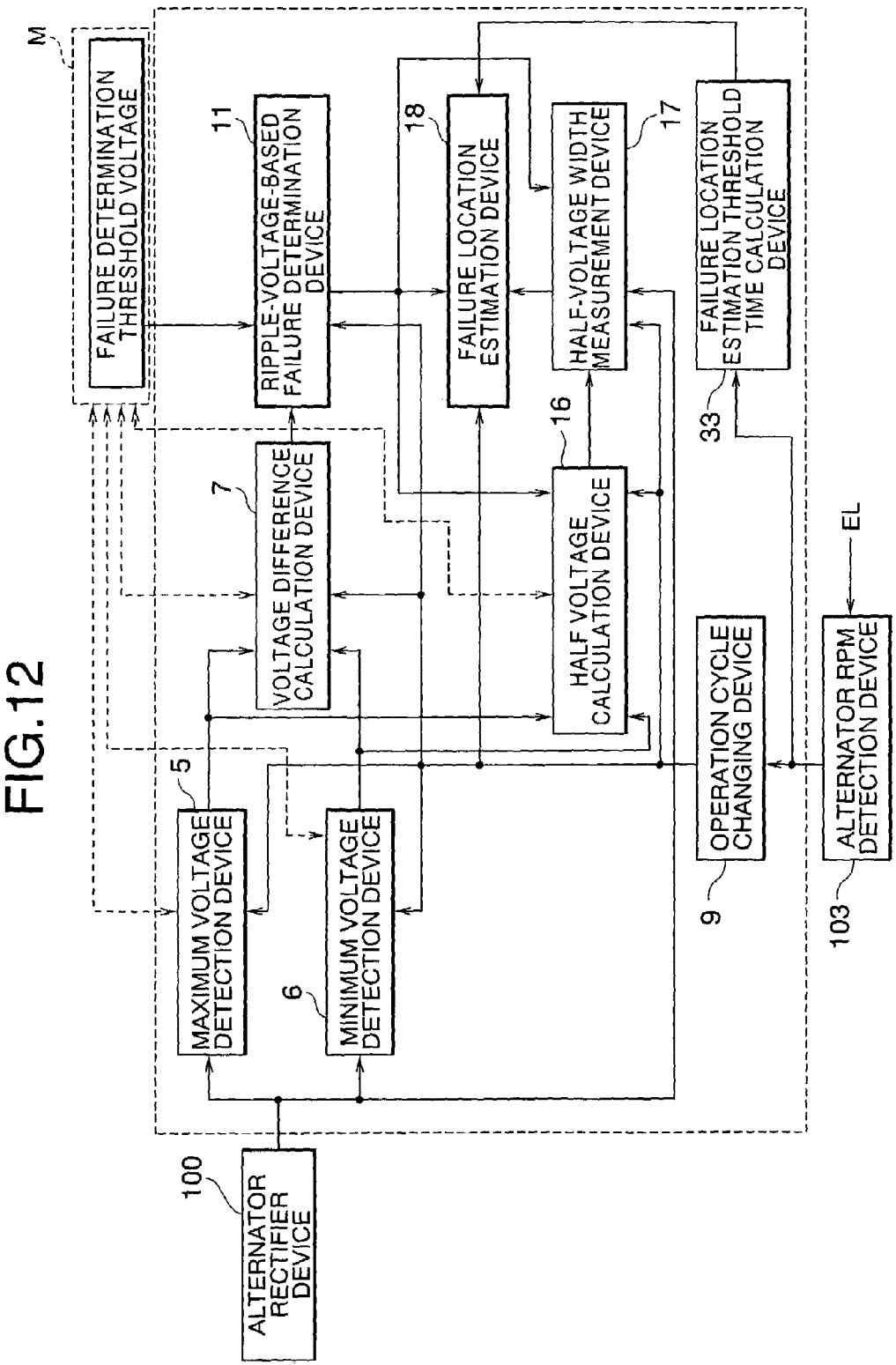
FIG. 12 is a view showing the configuration of a vehicular alternator failure determination apparatus according to a sixth embodiment of the present invention.

FIG. 12 is a block diagram that shows the configuration of a vehicular alternator failure determination apparatus according to a sixth embodiment of the present invention. In this embodiment, failure determinations and estimations of failure locations of a vehicular alternator are carried out by utilizing the facts that when there is a failure in a commutator element inside a rectifier or commutating device of the vehicular alternator, the waveform of an output voltage of the commutating device comes to include a ripple voltage waveform larger than that during normal operation thereof, and that when there is a failure in a commutator element in the commutating device, the half-value width of the voltage drop waveform of a ripple voltage resulting from a failure varies in accordance with the number of failure locations and the failure mode of the failed commutator elements, as shown in FIGS. 2(a) through 2(e).

In FIG. 12, an operation cycle changing device 9 changes the operation cycle of the vehicular alternator failure determination apparatus in accordance with the operating condition of a vehicle or the operating condition of the vehicular alternator. The operation cycle changing device 9 detects the number of revolutions per minute of the vehicular alternator as the operating condition of the vehicle by means of a vehicular alternator rpm detection device 103, and determines the operation cycle of the vehicular alternator failure determination apparatus in accordance with the number of revolutions per minute of the vehicular alternator thus detected. The alternator rpm detection device 103 can be realized by estimating the number of revolutions per minute of the vehicular alternator from the number of revolutions per minute of the engine or by using a magnetic sensor or the like. A maximum voltage detection device 5 detects a maximum voltage Vmax6 of the output voltage of the vehicular alternator commutating device 100 which is input thereto within a cycle or period designated by the operation cycle changing device 9. A minimum voltage detection device 6 detects a minimum voltage Vmin6 of the output voltage of the vehicular alternator commutating device 100 which is input thereto within the cycle or period designated by the operation cycle changing device 9. These voltage detection devices 5, 6 can be achieved by inputting the output of the vehicular alternator commutating device 100 to a maximum value (or minimum value) hold circuit with a reset circuit or an AD (analog to digital) conversion port of a microcomputer.

A voltage difference calculation device 7 detects a difference Vdiff6 between the output Vmax6 of the maximum voltage detection device 5 and the output Vmin6 of the minimum voltage detection device 6 (see expression (9) below).

$$V\text{diff6}=V\text{max6}-V\text{min6} \quad (9)$$

The voltage difference calculation device 7 can be achieved by an analog subtraction circuit or an arithmetic unit in a microcomputer to whose AD (analog to digital) conversion ports the outputs of the maximum voltage detection device 5 and the minimum voltage detection device 6 are input, respectively. A ripple-voltage-based failure determination device 11 for making a failure determination based on a ripple voltage compares the output Vdiff6 of the voltage difference detector 7 with a prescribed failure determination threshold voltage Vth6. When the voltage difference detection device output Vdiff6 is equal to or greater than the failure determination threshold voltage Vth6 (see expression (10) below), it is determined that there is a failure in the vehicular alternator commutating device 100.

$$V\text{diff6}=V\text{max6}-V\text{min6} \geq V\text{th6} \quad (10)$$

The ripple-voltage-based failure determination device 11 can be realized by a comparator or by inputting the output of the voltage difference calculation device 7 and the failure determination threshold voltage to AD (analog to digital) conversion ports of a microcomputer.

When the failure determination device 11 determines that there takes place a failure in the vehicular alternator commutating device 100, a half-voltage calculation device 16 calculates an arithmetic average or mean Vhalf6 of the maximum voltage detection device output Vmax6 and the minimum voltage detection device output Vmin6 (see expression (11) below).

$$V\text{half}=(V\text{max6}+V\text{min6})/2 \quad (11)$$

The half-voltage calculation device 16 can be realized by a combination of an analog adder and a voltage divider circuit or by inputting the outputs of the maximum and minimum voltage detection devices 5, 6 to AD (analog to digital) conversion ports of a microcomputer. When the failure determination device 11 determines that there takes place a failure in the alternator commutating device 100, a half-voltage width measurement device 17 measures the time or duration for which the alternator commutating device output Valt6 is below the output Vhalf6 of the half-voltage calculation device 16. The half-voltage width measurement device 17 can be realized by a combination of a comparator and a counter or by inputting the output Vhalf6 of the half-voltage calculation device 16 and the output Valt6 of the alternator commutating device 100 to AD (analog to digital) conversion ports of a microcomputer.

When the failure determination device 11 determines that there is a failure in the alternator commutating device 100, a failure location estimation device 18 compares the output Thalf6 of the half-voltage width measurement device 17 with a failure location estimation threshold time Tth6 calculated by a failure location estimation threshold time calculation device 33 in accordance with the output of the alternator rpm detection device 103. When the output Thalf6 of the half-voltage width measurement device 17 is equal to or less than the failure location estimation threshold time Tth6 (see expression (12) below), it is determined that one commutator element in the alternator commutating device 100 is in an open-mode failure, whereas when the output Thalf6 of the half-voltage width measurement device 17 is greater than the failure location estimation threshold time Tth6 (see expression (13) below), it is determined that two or more commutator elements in the alternator commutating device 100 are in an open-mode failure, or one or more commutator element in the alternator commutating device 100 is in a short-circuit-mode failure.

$$T\text{half6} \leq T\text{th6} \quad (12)$$

$$T\text{half6} > T\text{th6} \quad (13)$$

The failure location estimation device 18 can be realized by a digital comparator or a microcomputer. A failure location estimation threshold time calculation device 31 can be realized by an analog subtraction circuit or an arithmetic unit inside a microcomputer.

Here, note that the vehicular alternator failure determination apparatus according to the sixth embodiment can be constructed by a microcomputer, and in this case, the devices 5 through 7, 9, 11, 16 through 18, and 33 of FIG. 12 further including, if necessary, the alternator rpm detection device 103 comprise corresponding functional blocks in the microcomputer including a memory M.

Figure 13:
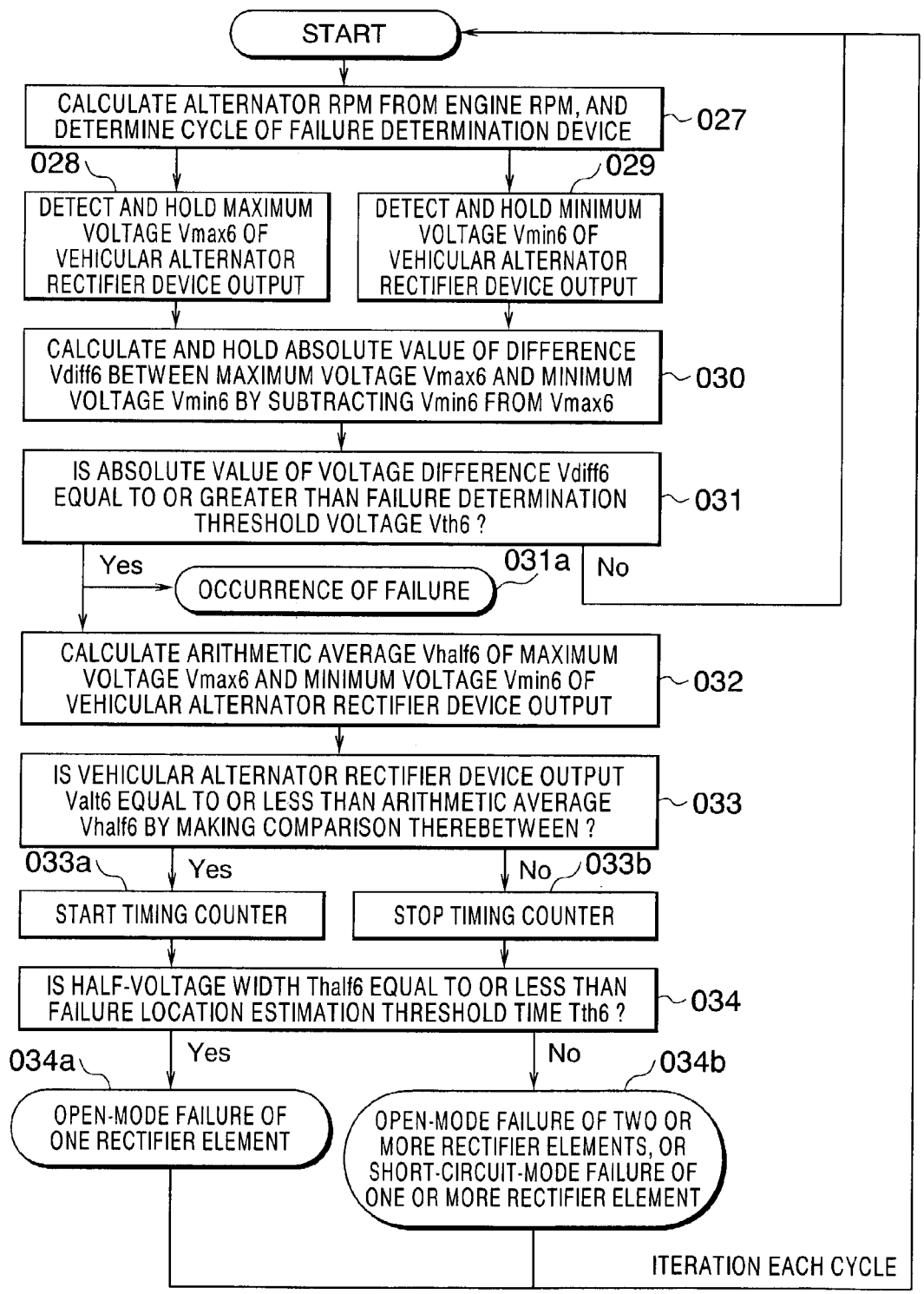
FIG. 13 is a flow chart explaining the operation of the vehicular alternator failure determination apparatus according to the sixth embodiment of the present invention.

FIG. 13 shows a flow chart of the operation of this sixth embodiment. In step 027, the operation cycle of the vehicular alternator failure determination apparatus is decided based on the number of revolutions per minute of the vehicular alternator which is obtained from information such as the number of revolutions per minute of the engine, etc. In step 028, the maximum voltage Vmax6 of the vehicular alternator rectifier or commutating device output in the cycle decided in step 027 for example is measured as the vehicular alternator output Valt, and stored in a memory (M in FIG. 12) or held by a maximum value hold circuit (5 in FIG. 12). Similarly, in step 029, the minimum voltage Vmin6 of the alternator commutating device output voltage in the cycle decided in step 027 is measured and stored in the memory (M in FIG. 12) or held by a minimum value hold circuit (6 in FIG. 12). In step 030, in the cycle decided in step 027, the difference Vdiff6 (absolute value) between the maximum voltage Vmax6 of the alternator commutating device output measured in step 028 and the minimum voltage Vmin6 of the alternator commutating device output measured in step 029 is calculated and stored in the memory or output in analog form. In step 031, the voltage difference Vdiff6 calculated in step 030 is compared with the prescribed failure determination threshold voltage Vth6, and when the voltage difference calculation device output Vdiff6 is equal to or greater than the failure determination threshold voltage Vth6, it is determined that there takes place a failure (step 031*a*).

When it is determined in step 031 that there takes place a failure, then in step 032, the arithmetic average or mean Vhalf6 of the maximum voltage Vmax6 of the alternator commutating device output measured in step 028 and the minimum voltage Vmin6 of the alternator commutating device output measured in step 029 is calculated and stored in the memory or output in analog form. When it is determined in step 031*a* that there takes place a failure, then in step 033, the arithmetic average or mean voltage Vhalf6 calculated in step 032 and the vehicular alternator commutating device output Valt6 are compared with each other. At the time when the vehicular alternator commutating device output Valt6 becomes equal to or less than the arithmetic mean voltage Vhalf6, the counter is started (step 033*a*), whereas when the vehicular alternator commutating device output Valt6 becomes larger than the arithmetic mean voltage Vhalf6, the counter is stopped (step 033*b*). When it is determined in step 031*a* that there takes place a failure, then in step 034, by utilizing the feature that the generation time widths or durations of generated voltage reduction waveforms are different in FIGS. 2(*b*), 2(*c*) and 2(*d*), the half-voltage width Thalf6, which has been measured by the half-voltage width measurement device 17 of FIG. 12 and corresponds to step 033*a*, and the failure location estimation threshold time Tth6, which has been decided by the failure location estimation threshold time calculation device 33 of FIG. 12 in accordance with the number of revolutions per minute of the vehicular alternator measured in step 027 corresponding to step 033*b* are compared with the count value of the timer counter. When the half-voltage width Thalf6 is equal to or less than the failure location estimation threshold time Tth6, it is determined that one commutator element in the alternator commutating device 100 is in an open-mode failure (step 034*a*), whereas when the half-voltage width Thalf6 is greater than the failure location estimation threshold time Tth6, it is determined that two or more commutator elements in the alternator commutating device 100 are in an open-mode failure, or one or more commutator element in the alternator commutating device 100 is in a short-circuit-mode failure (step 034*b*).

In this sixth embodiment, in addition to performing a failure determination of the vehicular alternator as a whole, it becomes possible to estimate failure locations and failure modes of the vehicular alternator commutating device 100 by observing or monitoring the waveform of a ripple voltage caused by a failure.

Embodiment 7.

Figure 14:
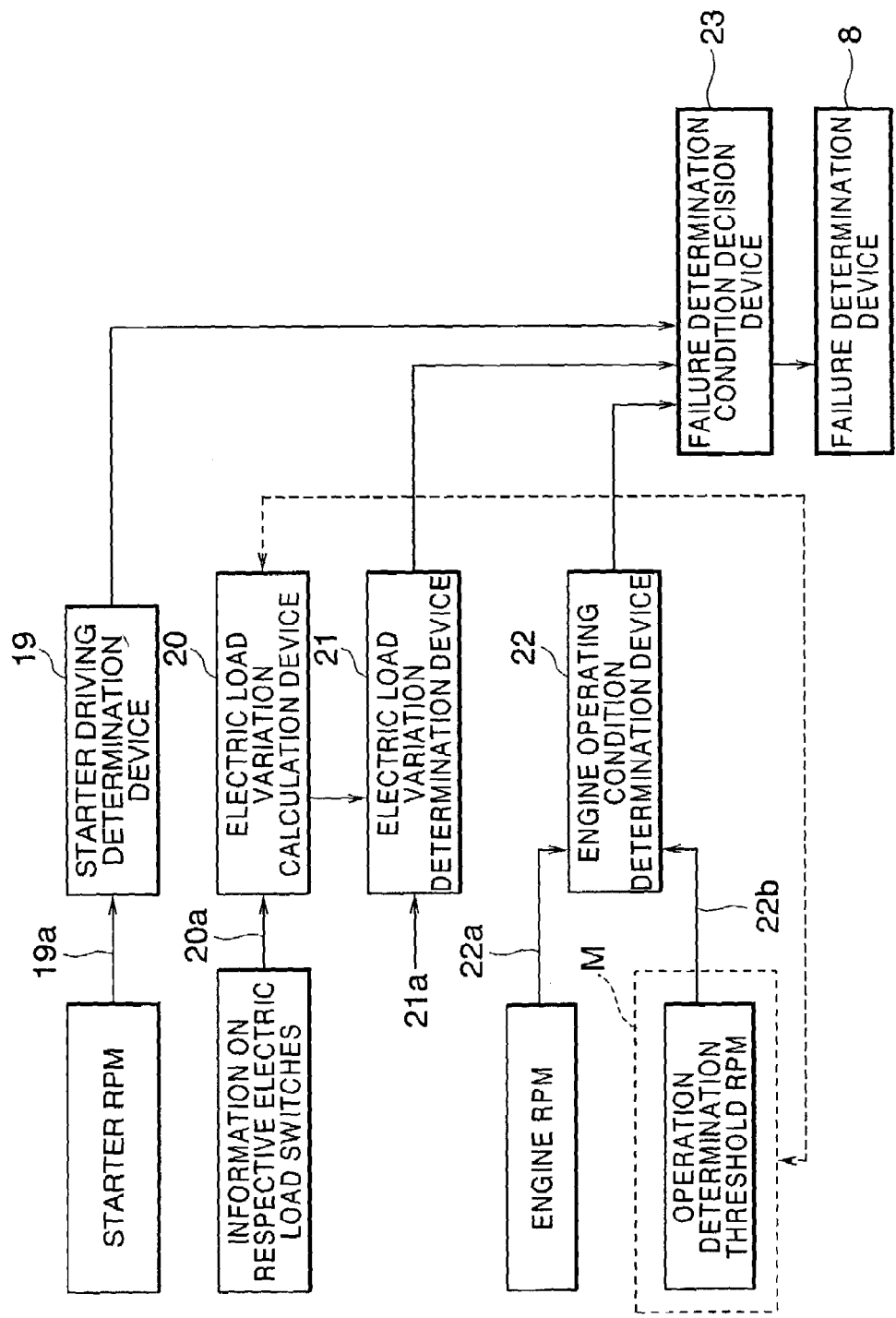
FIG. 14 is a view showing the configuration of a vehicular alternator failure determination apparatus according to a seventh embodiment of the present invention.

FIG. 14 is a block diagram that shows the configuration of a vehicular alternator failure determination apparatus according to a seventh embodiment of the present invention. In this embodiment, the conditions for performing a failure determination are decided by utilizing the fact that there is caused a great voltage variation in cases where electric current is supplied to a field coil of a vehicular alternator, or where electric loads in a vehicle varies greatly, or during the time from the actuation of a starter mounted on a vehicle until the engine of the vehicle starts to rotate under its own power for engine starting.

In FIG. 14, a starter driving determination device 19 identifies the driving condition of the vehicle-mounted starter, and detects whether the starter is in operation or in a stand still. The starter driving determination device 19 can be realized by detecting the state of a driving switch of the starter or by detecting the number of revolutions per minute of the starter by the use of a magnetic sensor, etc. In this connection, at least a starter driving determination signal 19*a* may be obtained for determining whether the starter is driven to run. An electric load variation calculation device 20 detects the driving condition of vehicle-mounted electric loads, and calculates the amount of electric loads Pele7. An electric load variation calculation device 20 collects switch information and a power consumption signal 20*a* for each vehicle-mounted electric load in a constant cycle, and calculates the absolute value of a difference Pdiff7 between the present electric loads Pele7 and the last (one cycle before) electric loads Pele7' (see expression (14) below).

$$Pdiff7 = |Pele7 - Pele7'| \quad (14)$$

An electric load variation determination device 21 compares the output Pele of the electric load variation calculation device 20 with a prescribed electric load variation threshold range Pth designated at 21*a* in FIG. 14, and when the output Pdiff7 of the electric load variation calculation device 20 is equal to or greater than the variation threshold range Pth (see expression (15) below), it is determined that a variation in the electric loads is large.

$$Pdiff7 = |Pele7 - Pele7'| \geq Pth7 \quad (15)$$

An engine operating condition determination device 22 detects the number of revolutions per minute of the vehicular engine Reng7 designated at 22*a* in FIG. 14, and compares the number of revolutions per minutes of the vehicular engine Reng7 with a prescribed operation determination threshold engine rpm Rth7 designated at 22*b* in FIG. 14. When the number of revolutions per minute of the vehicular engine Reng7 is equal to or greater than the operation determination threshold engine rpm Rth7 (see expression (16) below), it is determined that the engine is rotating at high speed, whereas when the number of revolutions per minute of the vehicular engine Reng7 is less than the operation determination threshold engine rpm Rth7 (see expression (17) below), it is determined that the engine is rotating at low speed, $$Reng7 \geq Rth7 \quad (16)$$

$$Reng7 < Rth7 \quad (17)$$

The engine operating condition determination device 22 can be realized by a comparator or a microcomputer which makes a comparison between the engine rpm information obtained from an engine control unit and the operation determination threshold engine rpm obtained from a memory M, etc. When the starter driving determination device 19 determines that the starter is in a stand still, and when the electric load variation determination device 21 determines that the electric load variation range within the constant cycle or period is small, and when the engine operating condition determination device 22 determines that the number of revolutions per minute of the engine is low, a failure determination condition decision device 23 decides that the conditions for failure determination are satisfied. The failure determination condition decision device 23 can be realized by a logic circuit or a microcomputer. When the failure determination condition decision device 23 decides that the conditions for failure determination are satisfied, the failure determination device 8 makes a determination as to whether the vehicular alternator is in a failure state.

Here, note that the vehicular alternator failure determination apparatus according to the seventh embodiment can be constructed by a microcomputer, and in this case, the devices 8, 19 through 23 of FIG. 14 comprise corresponding functional blocks in the computer including the memory M.

Figure 15:
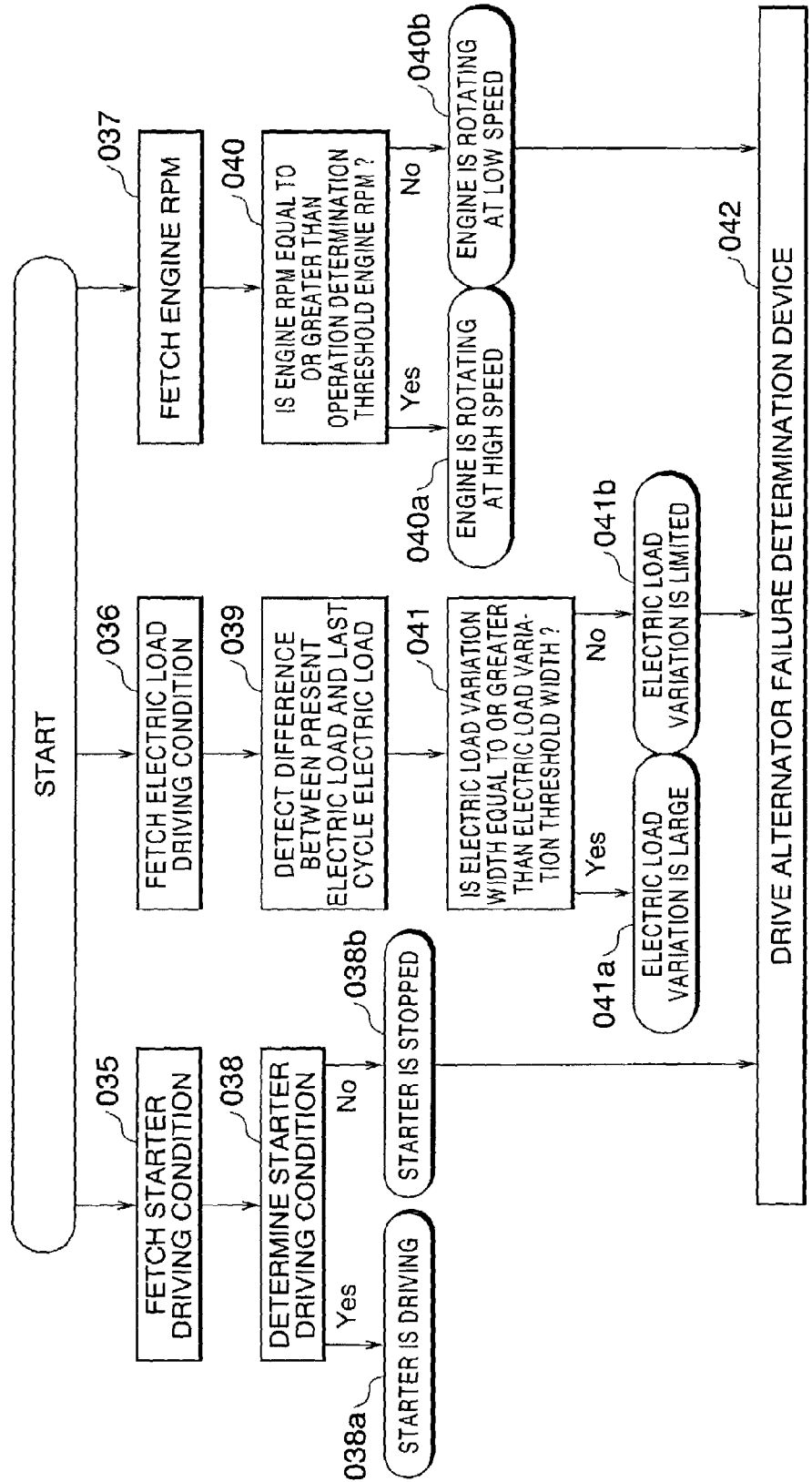
FIG. 15 is a flow chart explaining the operation of the vehicular alternator failure determination apparatus according to the seventh embodiment of the present invention.

FIG. 15 shows a flow chart of the operation of this seventh embodiment. In step 035, the driving condition of the starter mounted on the vehicle is detected and fetched. In step 038, based on the driving condition of the vehicle-mounted starter detected in step 035, it is determined whether the starter is in operation (steps 038a, 038b). In step 036, the driving condition of the electric loads mounted on the vehicle is detected and fetched. In step 039, a difference between the present driving condition of the vehicle-mounted electric loads currently detected in step 036 and the last driving condition of the vehicle-mounted electric loads previously measured one cycle before is detected. In step 041, the variation range of the vehicle-mounted electric loads calculated in step 039 is compared with the prescribed electric load variation threshold range, and then it is determined whether the variation range of the vehicle-mounted electric loads is equal to or greater than the electric load variation threshold range (steps 041a, 041b). In step 037, the number of revolutions per minute of the vehicular engine is detected and fetched. In step 040, the number of revolutions per minute of the vehicular engine detected in step 037 is compared with the prescribed operation determination threshold engine rpm, and it is determined whether the number of revolutions per minute of the engine is higher or lower than the prescribed operation determination threshold engine rpm (steps 040a, 040b). In step 042, whether the conditions for operation of the vehicular alternator failure determination apparatus are satisfied is determined based on the operating condition of the vehicle-mounted starter determined in step 038, the variation range of the electric loads determined in step 041, and the number of revolutions per minute of the vehicular engine being higher or lower than the prescribed operation determination threshold engine rpm, which has been determined in step 040.

Here, note that a considerable effect can be produced even by the provision of at least one of the starter driving determination device 19, the electric load variation determination device 21 and the engine operating condition determination device 22.

In this seventh embodiment, a determination is made for the operating condition of the starter, or the operating condition of the engine, or the load variation or fluctuation in the vehicle, any of which is a cause for misdetection in the failure determination of the vehicular alternator, so that a failure determination is not carried out, for instance when the starter is in operation, or when the number of revolutions per minute of the engine necessary to decide the operation cycle of the failure determination apparatus is too high, or when a variation in the electric loads is large. In this manner, the conditions for operation of the vehicular alternator failure determination apparatus are observed or monitored in accordance with the operating condition of the vehicle or the operating condition of the vehicular alternator so that it is decided whether the vehicular alternator failure determination apparatus can be operated. Therefore, it becomes possible to perform a failure determination of the vehicular alternator with a reduced probability of misdetection.

As described above, according to the present invention, it is possible to reduce misdetections by detecting a voltage reduction or drop upon failure of a vehicular alternator not as an absolute voltage value thereof but as a difference between a maximum voltage and a minimum voltage thereof. Moreover, when there takes place an overcharge in addition to a voltage reduction, such an overcharge can not be detected if the voltage reduction is detected as an absolute voltage value, but even in this case, it is still possible to detect the overcharge by detecting the magnitude of the difference between the maximum voltage and the minimum voltage thereof.

While the invention has been described in terms of preferred embodiments, those skilled in the art will recognize that the invention can be practiced with modifications within the spirit and scope of the appended claims.

What is claimed is:

1. A vehicular alternator failure determination apparatus comprising:
   a maximum voltage detection part for detecting a maximum voltage of an alternator commutating device which commutates an AC output of an alternator driven by an engine;
   a minimum voltage detection part for detecting a minimum voltage of said alternator commutating device;
   a voltage difference calculation part for calculating a difference voltage from outputs of said maximum and minimum voltage detection parts; and
   a failure determination part which determines that said alternator is in a failure state, when an output of said voltage difference calculation part is equal to or greater than a prescribed voltage.

2. The vehicular alternator failure determination apparatus as set forth in claim 1, wherein each of said parts operates in a prescribed cycle, and performs a failure determination of said vehicular alternator in said prescribed cycle.

3. The vehicular alternator failure determination apparatus as set forth in claim 2, further comprising:
   an operation cycle change part for changing said prescribed cycle in accordance with either the number of revolutions per minute of said alternator or the number of revolutions per minute of the engine;
   wherein the cycle of failure determination is changed according to the cycle of rotation of said vehicular alternator.

4. The vehicular alternator failure determination apparatus as set forth in claim 2, further comprising:
   an average voltage calculation part for calculating an average voltage of an output voltage of said alternator commutating device in said prescribed cycle; and
   a second failure determination part for making a failure determination of said alternator based on whether said average voltage is equal to or greater than a prescribed failure determination threshold average voltage.

5. The vehicular alternator failure determination apparatus as set forth in claim 2, further comprising:
   a half-voltage calculation part for calculating an arithmetic mean of said maximum voltage and said minimum voltage of said alternator commutating device when said failure determination part determines that there is a failure;
   a half-voltage width measurement part for measuring the time for which an output voltage of said alternator commutating device is below said arithmetic mean; and
   a failure location estimation part for estimating the location of failure based on whether said time for which an output voltage of said alternator commutating device is below said arithmetic mean is equal to or greater than a failure location estimation threshold time.

6. The vehicular alternator failure determination apparatus as set forth in claim 1, further comprising:
   at least one of a starter driving determination part for determining the driving condition of a starter of a vehicle, an electric load variation determination part for detecting the magnitude of a variation in electric loads in the vehicle, and an engine operating condition determination part for determining the operating condition of said engine; and a failure determination condition decision part for deciding a failure determination execution time for said vehicular alternator in accordance with the result of the determination made by at least one of said starter driving determination part, said electric load variation determination part and said engine operating condition determination part.

7. A vehicular alternator failure determination apparatus comprising:

an average voltage calculation part for calculating an average voltage in a prescribed cycle of an output voltage of an alternator commutating device which commutates an AC output of an alternator driven by an engine;

a ripple voltage detection part for detecting the generation of a ripple voltage when a voltage difference between an output voltage of said alternator commutating device and an average voltage thereof in the last cycle becomes equal to or greater than a prescribed ripple determination voltage difference;

a ripple voltage counting part for counting the number of generations of failure ripple voltages within said prescribed cycle; and a failure location estimation part for estimating the location of failure from the number of generations of failure ripple voltages;

wherein each of said parts operates in said prescribed cycle.

8. The vehicular alternator failure determination apparatus as set forth in claim 7, further comprising an operation cycle change part for changing said prescribed cycle in accordance with either the number of revolutions per minute of said alternator or the number of revolutions per minute of the engine, wherein the cycle of failure determination is changed according to the cycle of rotation of said vehicular alternator.

9. The vehicular alternator failure determination apparatus as set forth in claim 8, further comprising:

an average voltage calculation part for calculating an average voltage of an output voltage of said alternator commutating device in said prescribed cycle; and a second failure determination part for making a failure determination of said alternator based on whether said average voltage is equal to or greater than a prescribed failure determination threshold average voltage.

10. The vehicular alternator failure determination apparatus as set forth in claim 8, further comprising:

a half-voltage calculation part for calculating an arithmetic mean of said maximum voltage and said minimum voltage of said alternator commutating device when said failure determination part determines that there is a failure;

a half-voltage width measurement part for measuring the time for which an output voltage of said alternator commutating device is below said arithmetic mean; and a failure location estimation part for estimating the location of failure based on whether said time for which an output voltage of said alternator commutating device is below said arithmetic mean is equal to or greater than a failure location estimation threshold time.

11. The vehicular alternator failure determination apparatus as set forth in claim 7, further comprising:

at least one of a starter driving determination part for determining the driving condition of a starter of a vehicle, an electric load variation determination part for detecting the magnitude of a variation in electric loads in the vehicle, and an engine operating condition determination part for determining the operating condition of said engine; and a failure determination condition decision part for deciding a failure determination execution time for said vehicular alternator in accordance with the result of the determination made by at least one of said starter driving determination part, said electric load variation determination part and said engine operating condition determination part.

* * * * *